US012164237B2

(12) United States Patent
Ha

(10) Patent No.: US 12,164,237 B2
(45) Date of Patent: Dec. 10, 2024

(54) DISPLAY DEVICE HAVING MAGNETIC ALIGNMENT MARKS

(71) Applicant: SAMSUNG DISPLAY CO., LTD., Yongin-si (KR)

(72) Inventor: Young Sang Ha, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 533 days.

(21) Appl. No.: 17/472,790

(22) Filed: Sep. 13, 2021

(65) Prior Publication Data

US 2022/0221803 A1 Jul. 14, 2022

(30) Foreign Application Priority Data

Jan. 8, 2021 (KR) .................. 10-2021-0002256

(51) Int. Cl.
*G03F 9/00* (2006.01)
*H01L 23/544* (2006.01)
*H01L 27/12* (2006.01)
*H01L 33/58* (2010.01)

(52) U.S. Cl.
CPC .......... *G03F 9/7076* (2013.01); *H01L 23/544* (2013.01); *H01L 27/1214* (2013.01); *H01L 33/58* (2013.01)

(58) Field of Classification Search
CPC ...... G03F 9/7076; H01L 23/544; H01L 33/58
See application file for complete search history.

(56) References Cited

U.S. PATENT DOCUMENTS

| 2008/0068720 | A1* | 3/2008 | Shigemura | ........... G02B 3/0025 359/619 |
| 2015/0015462 | A1* | 1/2015 | Lee | ........... H04N 13/305 361/679.01 |
| 2018/0017802 | A1* | 1/2018 | Katsumoto | ........... H04N 1/00201 |
| 2022/0223483 | A1* | 7/2022 | Chaji | ........... H01L 22/20 |

FOREIGN PATENT DOCUMENTS

| KR | 10-2011-0015157 | 2/2011 |
| KR | 10-2013-0031492 | 3/2013 |
| KR | 10-2015-0006993 | 1/2015 |
| KR | 10-2015-0074452 | 7/2015 |
| KR | 10-1925459 | 12/2018 |

OTHER PUBLICATIONS

"Nearly room temperature ferromagnetism in a magnetic metal-rich van der Waals metal" by Seo et al. (Year: 2020).*

* cited by examiner

*Primary Examiner* — Jay C Chang
*Assistant Examiner* — Mikka Liu
(74) *Attorney, Agent, or Firm* — F. CHAU & ASSOCIATES, LLC

(57) ABSTRACT

A display device includes: an optical member including a plurality of lenses and a first alignment mark disposed to overlap at least one lens of the plurality of lenses; and a display panel including a plurality of subpixels and a second alignment mark disposed between the plurality of subpixels and overlapping the first alignment mark, wherein each of the first alignment mark and the second alignment mark includes a magnetic substance.

15 Claims, 18 Drawing Sheets

DISPLAY DEVICE HAVING MAGNETIC ALIGNMENT MARKS

CROSS-REFERENCE TO RELATED APPLICATION

This application claims priority under 35 U.S.C. § 119 to Korean Patent Application No. 10-2021-0002256, filed on Jan. 8, 2021, in the Korean Intellectual Property Office, the disclosure of which is incorporated by reference herein in its entirety.

TECHNICAL FIELD

The present invention relates to a display device and a method of manufacturing the same.

DISCUSSION OF THE RELATED ART

As the information society develops, desires for display devices for displaying images are increasing in various forms. Accordingly, various types of display devices such as liquid crystal displays (LCDs), plasma display panels (PDPs), and organic light emitting displays (OLED) are being utilized.

Recently, a stereoscopic image display device and a viewing angle control display device have been under development. Generally, the stereoscopic image display device and the viewing angle control display device display an image that is divided, and the divided image is displayed in a space in front of the display device by using an optical member. The stereoscopic image display device, typically, displays a left-eye image and a right-eye image separately to provide a three-dimensional (3D) effect due to binocular parallax. The viewing angle control display device displays a plurality of viewing angle images separately to provide different images to users located at different viewing angles from the display device.

SUMMARY

According to an embodiment of the present invention, a display device includes: an optical member including a plurality of lenses and a first alignment mark disposed to overlap at least one lens of the plurality of lenses; and a display panel including a plurality of subpixels and a second alignment mark disposed between the plurality of subpixels and overlapping the first alignment mark, wherein each of the first alignment mark and the second alignment mark includes a magnetic substance.

In an embodiment of the present invention, the magnetic substance includes a two-dimensional (2D) magnet including a single magnetic atomic layer.

In an embodiment of the present invention, the magnetic substance includes iron-germanium-ditelluride (Fe4GeTe2).

In an embodiment of the present invention, a thickness of the magnetic substance is about 1 nm to about 1000 nm.

In an embodiment of the present invention, the first alignment mark overlaps a lens, among the plurality of lenses, passing through a center of the optical member, and the second alignment mark is disposed between subpixels among the plurality of subpixels, wherein the subpixels of the plurality of subpixels are overlapped by the lens passing through the center of the optical member.

In an embodiment of the present invention, the display panel includes an active area and a non-active area, wherein the active area provides an image, wherein the non-active area does not provide the image, and wherein the second alignment mark is disposed in the active area.

In an embodiment of the present invention, the first alignment mark includes a first sub-alignment mark and a second sub-alignment mark spaced apart from each other, and the second alignment mark includes a third sub-alignment mark and a fourth sub-alignment mark spaced apart from each other, wherein the first sub-alignment mark overlaps the third sub-alignment mark in a thickness direction, and the second sub-alignment mark overlaps the fourth sub-alignment mark in the thickness direction.

In an embodiment of the present invention, the first sub-alignment mark and the third sub-alignment mark have different polarities from each other, and the second sub-alignment mark and the fourth sub-alignment mark have different polarities from each other.

In an embodiment of the present invention, the first alignment mark is disposed adjacent to at least one corner of a plurality of corners of the optical members, and the second alignment mark is disposed adjacent to at least one corner of a plurality of corners of the display panel.

In an embodiment of the present invention, the display panel includes an active area and a non-active area, wherein the active area provides an image, wherein the non-active area does not provide the image, and wherein the second alignment mark is disposed in the non-active area.

In an embodiment of the present invention, the second alignment mark is disposed between dead pixels, of the plurality of subpixels, disposed in the non-active area.

In an embodiment of the present invention, the display panel includes an active area and a non-active area, wherein the active area provides an image, wherein the non-active area does not provide the image, and wherein the second alignment mark is disposed in the active area.

In an embodiment of the present invention, the first alignment mark and the second alignment mark extend in a direction intersecting a direction in which each of the plurality of lenses extends.

In an embodiment of the present invention, the second alignment mark is disposed in a non-emission area between the plurality of subpixels.

In an embodiment of the present invention, a plurality of view images provided by the plurality of subpixels are refracted by the plurality of lenses to a plurality of view-points, respectively.

According to an embodiment of the present invention, a method of manufacturing a display device includes: aligning a first alignment mark with a second alignment mark, wherein the first alignment mark is marked to overlap a plurality of lenses of an optical member, and the second alignment mark is marked between a plurality of subpixels of a display panel; and bonding the optical member and the display panel together, wherein each of the first alignment mark and the second alignment mark includes a two-dimensional (2D) magnet.

In an embodiment of the present invention, the aligning of the first alignment mark with the second alignment mark includes at least one of aligning the first alignment mark, which is located at a center of the optical member, with the second alignment mark, which is located at a center of the display panel, or aligning the first alignment mark, which is located at a corner of the optical member, with the second alignment mark, which is located at a corner of the display panel.

In an embodiment of the present invention, the aligning of the first alignment mark with the second alignment mark includes aligning the optical member with the display panel by using a magnetic force acting between the first alignment mark and the second alignment mark.

In an embodiment of the present invention, a thickness of the 2D magnet is about 1 nm to about 1000 nm.

In an embodiment of the present invention, the method further includes marking the first alignment mark on the optical member, and marking the second alignment mark on the display panel.

BRIEF DESCRIPTION OF THE DRAWINGS

The above and/or other features of the present invention will become more apparent by describing in detail embodiments of the present invention, with reference to the accompanying drawings in which.

DETAILED DESCRIPTION OF EMBODIMENTS

Figure 1:
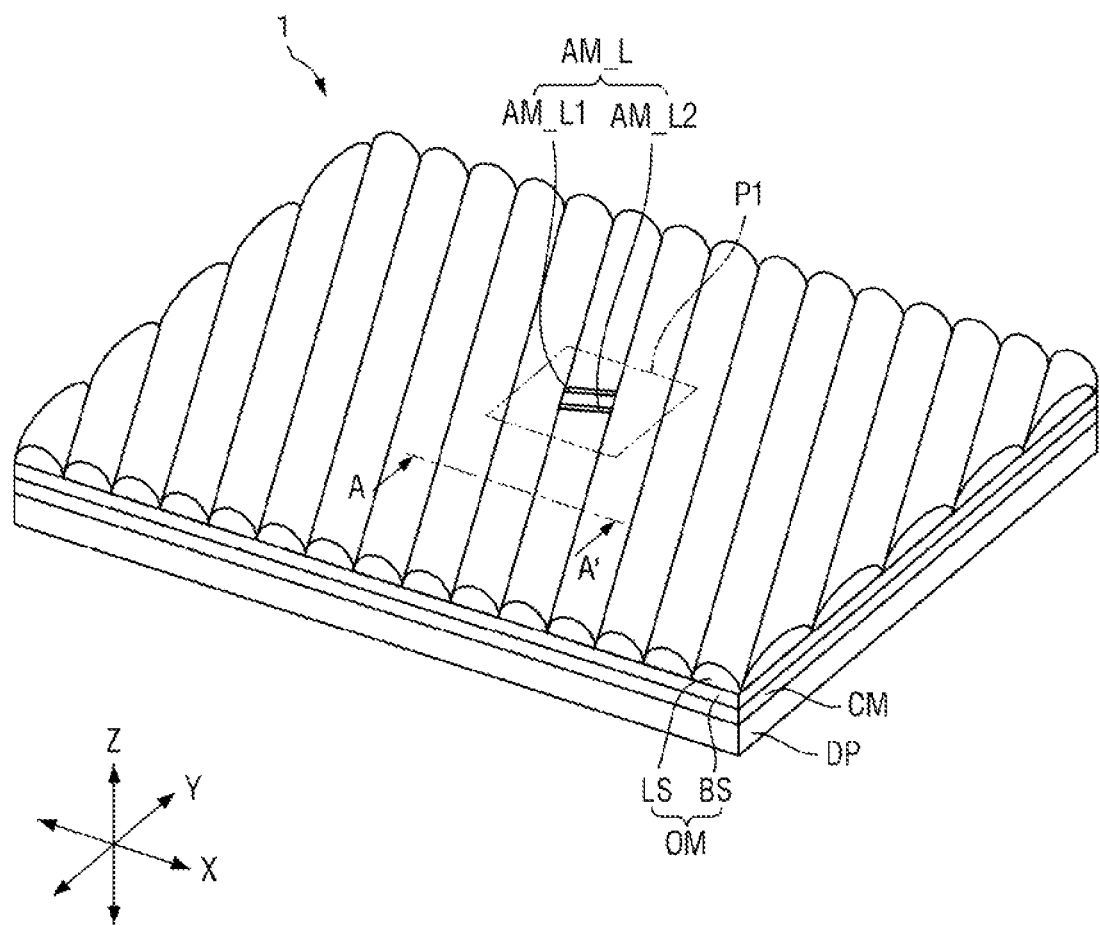
FIG. 1 is a perspective view of a display device according to an embodiment of the present invention.

The present invention will now be described more fully hereinafter with reference to the accompanying drawings. This invention may, however, be embodied in different forms and should not be construed as limited to the embodiments set forth herein. The same reference numbers may indicate the same components throughout the specification. In the attached figures, the thickness of layers and regions may be exaggerated for clarity. In other words, since sizes and thicknesses of components in the drawings may be exaggerated for clarity, the following embodiments of the present invention are not limited thereto.

It will also be understood that when a layer is referred to as being "on" another layer or substrate, it can be directly on the other layer or substrate, or intervening layers may be present. In contrast, when an element is referred to as being "directly on" another element, there are no intervening elements present.

Hereinafter, embodiments of the present invention will be described with reference to the accompanying drawings.

Figure 2:
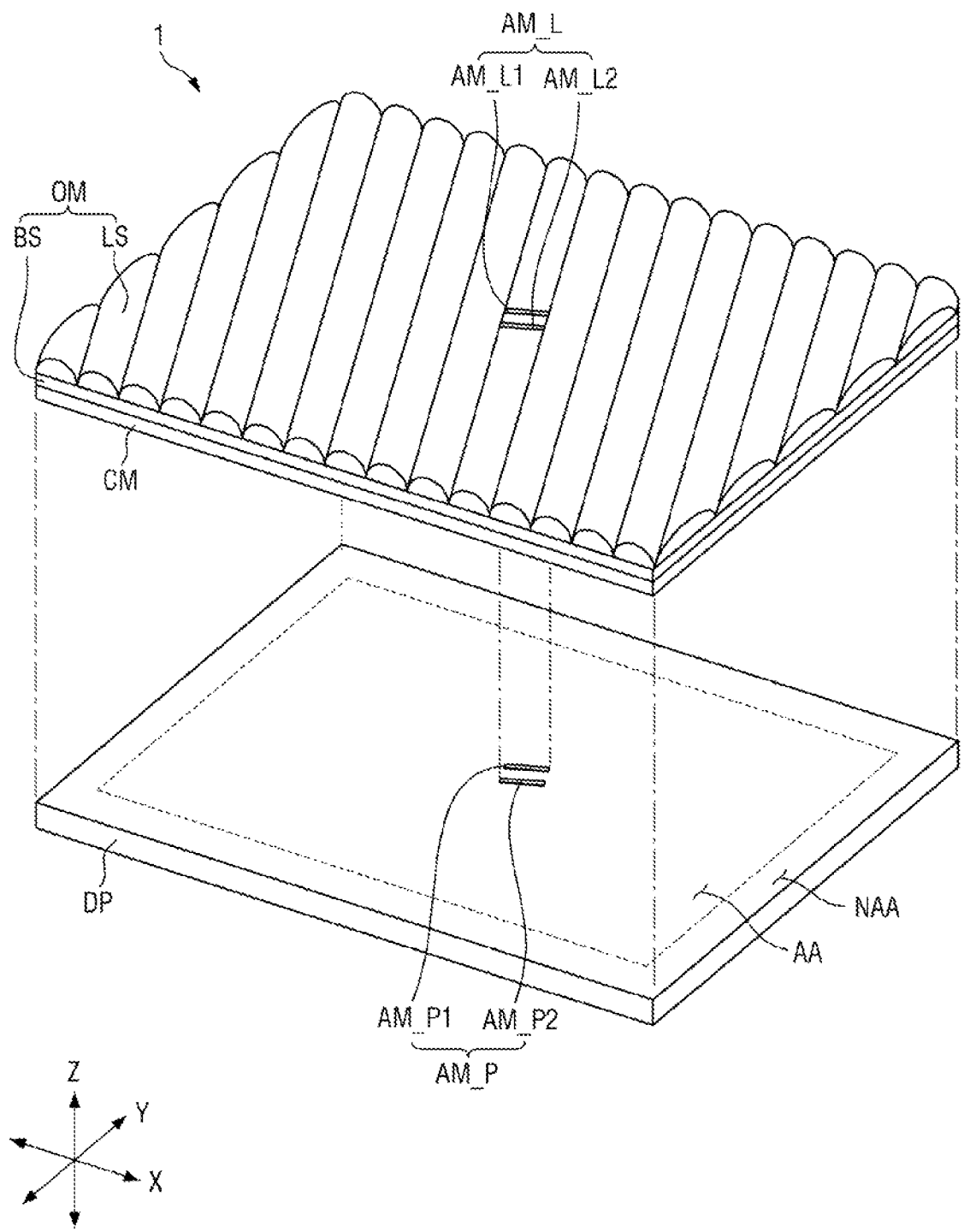
FIG. 2 is an exploded perspective view of the display device according to the embodiment of the present invention.

FIG. 1 is a perspective view of a display device 1 according to an embodiment of the present invention. FIG. 2 is an exploded perspective view of the display device 1 according to the embodiment of the present invention.

In the following description, a first direction X, a second direction Y, and a third direction Z intersect each other from different directions. In an embodiment of the present invention, the first direction X, the second direction Y, and the third direction Z may be substantially perpendicular each other. For example, the first direction X may be a horizontal direction, the second direction Y may be a vertical direction, and the third direction Z may be a thickness direction. Each of the first direction X, the second direction Y, and/or the third direction Z may include two or more directions. For example, the third direction Z may include an upward direction toward an upper side of the drawings and a downward direction toward a lower side of the drawings. In this case, a surface of a member which faces in the upward direction may be referred to as an upper surface, and the other surface of the member which faces in the downward direction may be referred to as a lower surface. However, the above directions are illustrative and relative and are not limited to those mentioned above.

The following display device 1 may be a stereoscopic image display device. The stereoscopic image display device may display a left-eye image and a right-eye image in a space in front of the display device 1 to provide a three-dimensional (3D) effect due to binocular parallax. Further, the stereoscopic image display device may provide a plurality of viewing angle images, separately, in the space in front of the display device 1 to show different images at different viewing angles.

The stereoscopic image display device may include a light field display device in which a member, such as a barrier or a lenticular lens LS, is disposed on a display panel DP so that different pieces of image information from each other are input to both eyes of a viewer.

The light field display device may create a stereoscopic image by generating a light field using the display panel DP and a 3D optical system. As will be described later, light rays generated by each pixel of the display panel DP of the light field display device may form a light field directed in a predetermined direction (e.g., a specific viewing angle and/or a specific viewpoint) by a lens LS, a pinhole or a barrier. Accordingly, stereoscopic image information corresponding to the predetermined direction may be provided to the viewer.

Referring to FIG. 1, the display device 1 may include an optical member OM and the display panel DP.

The optical member OM may be disposed on an upper surface of the display panel DP. The upper surface of the display panel DP may be a surface located in a direction in which an image or a video is displayed, and a lower surface of the display panel DP may be a surface opposite the upper surface. The upper surface and the lower surface of the display panel DP may be a front surface and a back surface of the display panel DP, respectively.

The optical member OM may include a base member BS, a plurality of lenses LS, and a first alignment mark AM_L.

The base member BS may be disposed on the upper surface of the display panel DP. For example, the base member BS may be formed as a film-type member having a relatively small thickness.

The base member BS may be disposed on an active area AA and a non-active area NAA of the display panel DP to be described later. For example, the base member BS may overlap the active area AA and the non-active area NAA of the display panel DP in the thickness direction to cover the active area AA and the non-active area NAA. For example, the base member BS may completely overlap the active area AA and the non-active area NAA of the display panel DP in the thickness direction to completely cover the active area AA and the non-active area NAA. However, the present invention is not limited thereto, and for example, the base member BS may be disposed to cover the active area AA but to cover only a part of the non-active area NAA.

The lenses LS may be disposed on an upper surface of the base member BS. The lenses LS may overlap the active area AA and the non-active area NAA in the thickness direction. For example, the lenses LS may completely overlap the active area AA and the non-active area NAA. However, the present invention is not limited thereto, and for example, lenses LS may be disposed to cover the active area AA and only a part of the non-active area NAA.

The lenses LS may be arranged at predetermined intervals to form a lens array. The lenses LS may be slanted lenses inclined with respect to the first direction X and the second direction Y in a plan view. The first direction X and/or the second direction Y may be directions in which long and short sides of the display device 1 extend and/or directions in which a plurality of pixels to be described later are arranged. For example, the lenses LS may extend in one direction intersecting the first direction X and the second direction Y in a plan view, and may be arranged in another direction intersecting and/or orthogonal to the one direction in a plan view. The one direction and the other direction may also be referred to as a fourth direction and a fifth direction, respectively.

Each of the lenses LS may be a lenticular lens having a semi-cylindrical shape, and the optical member OM may be a lenticular lens array film. For example, the optical member OM may also include a Fresnel lens.

The first alignment mark AM_L may be disposed at a center OM_C of the optical member OM and/or in a part adjacent to the center OM_C. The center OM_C of the optical member OM may be a part overlapping a center DP_C of the display panel DP in the thickness direction, to be described later.

The first alignment mark AM_L may be disposed on at least one of the base member BS and a lens LS. The first alignment mark AM_L may overlap at least one lens LS and the base member BS in the thickness direction. The first alignment mark AM_L may be disposed on a flat surface. In this case, distortion of the first alignment mark AM_L can be prevented. For example, the first alignment mark AM_L may be disposed on a lower surface of the base member BS which faces the display panel DP and/or the upper surface of the base member BS which faces the lenses LS. However, the present invention is not limited thereto, and the first alignment mark AM_L may also be disposed on an upper surface of a lens LS. As an additional example, the first alignment mark AM_L may be disposed on a lower surface of a lens LS.

The first alignment mark AM_L may overlap the active area AA of the display panel DP in the thickness direction. At least a part of the first alignment mark AM_L may overlap a second alignment mark AM_P located in the active area AA in the thickness direction.

The display panel DP may be a light emitting display panel including light emitting elements. For example, the display panel DP may be, but is not limited to, an organic light emitting display panel, which uses organic light emitting diodes that include organic light emitting layers, a micro light emitting diode display panel, which uses micro light emitting diodes, a quantum dot light emitting display panel, which uses quantum dot light emitting diodes that include quantum dot light emitting layers, or an inorganic light emitting display panel, which uses inorganic light emitting elements that include inorganic semiconductors.

The display panel DP may have a rectangular shape in a plan view. The display panel DP may have long sides in the first direction X and short sides in the second direction Y. Each corner where a long side extending in the first direction X meets a short side extending in the second direction Y may be rounded with a predetermined curvature or may be right-angled. The planar shape of the display panel DP is not limited to a quadrangular shape but may be similar to other polygonal shapes, a circular shape, or an elliptical shape.

The display panel DP may include the active area AA and the non-active area NAA disposed around the active area AA. For example, the non-active area NAA may be adjacent to the active area AA, and the non-active area NAA may at least partially surround the active area AA.

The active area AA may be an area in which an image and/or a video is displayed, and the non-active area NAA may be an area in which no image and/or video is displayed. The active area AA may be an area in which a plurality of pixels PX (see FIG. 3) are driven to provide light to display an image and/or a video, and the non-active area NAA may be an area in which the pixels PX (see FIG. 3) are not driven.

The non-active area NAA may be disposed around the active area AA to surround at least a part of the active area AA. For example, the active area AA may have a rectangular shape in a plan view, and the non-active area NAA may be disposed with a rectangular shape, with an opening, surrounding four edges of the active area AA. However, the present invention is not limited thereto, and the non-active area NAA may surround only a part of the active area AA.

The active area AA may be an area in which the pixels PX (see FIG. 3) are disposed, and the non-active area NAA may be an area in which the pixels PX (see FIG. 3) are not disposed. However, the present invention is not limited thereto, and at least one pixel PX (see FIG. 3) may also be disposed in the non-active area NAA.

Referring to FIG. 2, the display panel DP may further include the second alignment mark AM_P.

The second alignment mark AM_P may be disposed in the active area AA of the display panel DP. The second alignment mark AM_P may be disposed at the center DP_C of the display panel DP and/or in a part adjacent to the center DP_C. The center DP_C of the display panel DP may overlap the center OM_C of the optical member OM in the thickness direction.

Each of the first alignment mark AM_L and the second alignment mark AM_P may include a magnetic substance. For example, the magnetic substance may be a two-dimensional (2D) magnet made of a single magnetic atomic layer. The 2D magnet may include at least one of iron, germanium, and/or ditelluride. For example, the 2D magnet may include iron-germanium-ditelluride ($Fe_4GeTe_2$) and have a very small thickness of about 1 to about 1000 nm, but the present invention is not limited thereto.

As will be described later, when the display panel DP and the optical member OM are bonded together, the display panel DP and the optical member OM may be aligned by a magnetic force provided by the first alignment mark AM_L and the second alignment mark AM_P. The second alignment mark AM_P and the first alignment mark AM_L will be described later with further reference to FIGS. 4 and 5.

The display device 1 may further include a coupling member CM. The coupling member CM may be interposed between the display panel DP and the optical member OM to bond the display panel DP and the optical member OM together. The coupling member CM may be optically clear. For example, the coupling member CM may include an optically clear adhesive or an optically clear resin. For another example, the coupling member CM may include an ultraviolet curing resin and/or a thermosetting resin.

Figure 3:
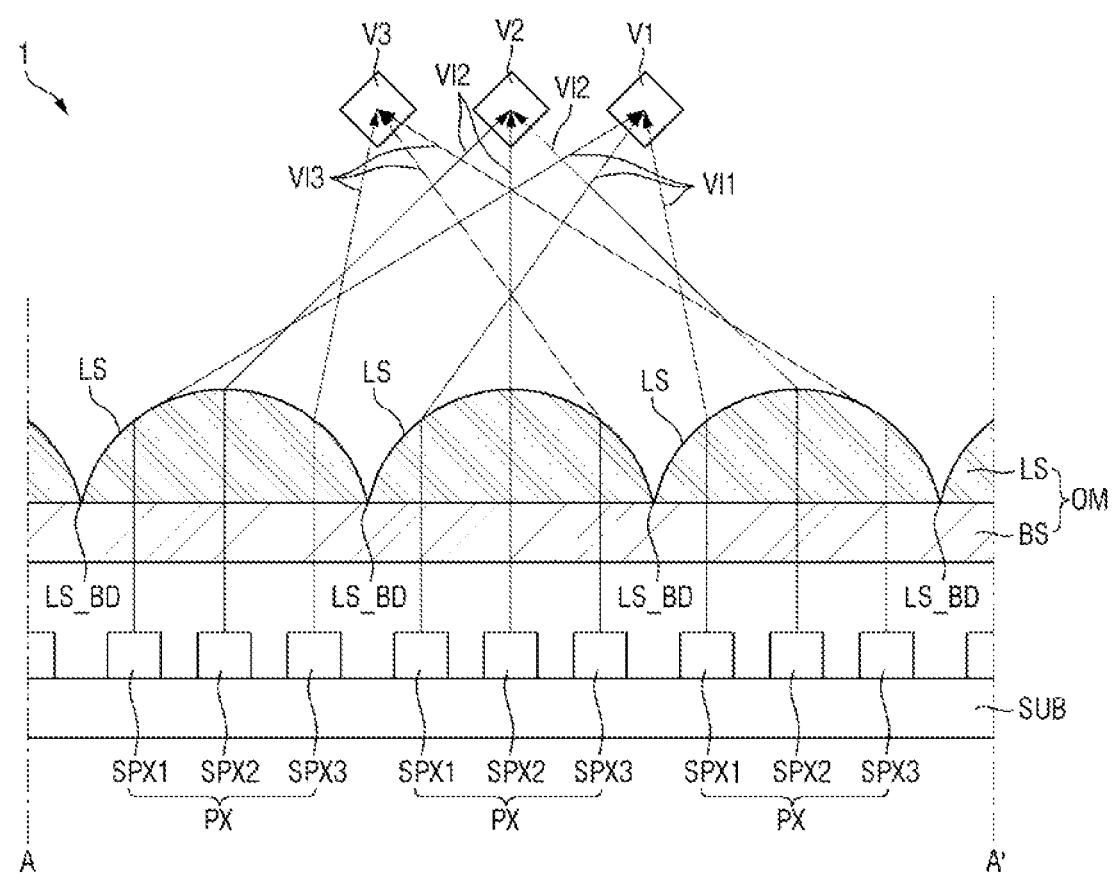
FIG. 3 is a cross-sectional view taken along line A-A' of FIG. 1.

FIG. 3 is a cross-sectional view taken along line A-A' of FIG. 1.

FIG. 3 conceptually illustrates a method of implementing a stereoscopic image and viewing angle control of the display device 1.

In FIG. 3, only three pixels PX and three lenses LS of the display panel DP are illustrated for ease of description, but the number of pixels PX and lenses LS is not limited thereto.

Referring to FIG. 3, the display panel DP may include a substrate SUB and a plurality of pixels PX disposed on the substrate SUB.

The substrate SUB may include an organic polymer material such as polyethylene, polyimide, polycarbonate, polysulfone, polyacrylate, polystyrene, polyvinyl chloride, polyvinyl alcohol, polynorbonene, or polyester.

The pixels PX may be disposed on a surface of the substrate SUB which faces the optical member OM.

Each of the pixels PX may include a plurality of subpixels SPX. Each of the subpixels SPX may be a minimum unit that can express a gray level. Each of the pixels PX may be a group of subpixels SPX for expressing a white gray level. In FIG. 3, three subpixels SPX are illustrated in each pixel PX for ease of description. However, the number of subpixels SPX constituting one pixel is not limited thereto. In addition, in FIG. 3, three subpixels SPX are overlapped by one lens LS in the thickness direction. However, the number of subpixels SPX overlapped by one lens LS is not limited thereto.

The subpixels SPX may include a first subpixel SPX1, a second subpixel SPX2, and a third subpixel SPX3.

Each of the first subpixel SPX1, the second subpixel SPX2, and the third subpixel SPX3 may emit any one of light of a first color, light of a second color, and light of a third color. Here, for example, the first color may be red, the second color may be green, and the third color may be blue, but the present invention is not limited thereto. The subpixels SPX may further include a fourth subpixel SPX emitting white light.

A plurality of first subpixels SPX1 may be disposed adjacent to a first side of each lens LS. A plurality of second subpixels SPX2 may be disposed in the middle of each lens LS, and a plurality of third subpixels SPX3 may be disposed adjacent to a second side of each lens LS. For example, the plurality of second subpixels SPX2 may be disposed between the plurality of first subpixels SPX' and the plurality of third subpixels SPX3. For example, as illustrated in FIG. 3, the first side and the second side may be a left side and a right side of each lens LS in cross section, respectively.

The first subpixels SPX1, the second subpixels SPX2, and the third subpixels SPX3 may provide a first view image VI1, a second view image VI2, and a third view image VI3, respectively.

The first view image VI1 displayed by the first subpixels SPX1, the second view image VI2 displayed by the second subpixels SPX2, and the third view image VI3 displayed by the third subpixels SPX3 may be displayed in separate spaces in front of the display device 1.

The first view image VI1, the second view image VI2, and the third view image VI3 may be refracted by the lenses LS to a first viewpoint V1, a second viewpoint V2 and a third viewpoint V3, respectively. For example, as illustrated in FIG. 3, the second viewpoint V2 may be located in a middle area of the display device 1. The first viewpoint V1 may be located in a right area of the display device 1, and the third viewpoint V3 may be located in a left area of the display area 1. The term 'viewpoint' may also be a viewing area in which a specific view image can be viewed.

The first view image VI1, the second view image VI2, and the third view image VI3 may be images generated in consideration of binocular parallax. When a user's left eye and right eye are located at different viewpoints among the first viewpoint V1, the second viewpoint V2 and the third viewpoint V3, the user may experience a 3D effect due to binocular parallax. For example, the first viewpoint V1, the second viewpoint V2, and the third viewpoint V3 may respectively provide images of an object viewed at a first angle θ1, at a second angle θ2 different from the first angle θ1, and at a third angle θ3 different from the first angle θ1 and the second angle θ2.

The first view image VI1, the second view image VI2, and the third view image VI3 may be different images from each other. For example, when the display device 1 is applied to a vehicle display, the first view image VI1 may be a navigation image, the second view image VI2 may be an image showing vehicle information, and the third view image VI3 may be an entertainment image showing a movie. In this case, a user located at the first viewpoint V1 may view only the navigation image. Further, a user located at the second viewpoint V2 may view only the image showing the vehicle information, and a user located at the third viewpoint V3 may view only the entertainment image. For example, the display device 1 may show different images to users located at different viewing angles.

In FIG. 3, for ease of description, three view images VI1 through VI3 are provided to three viewpoints V1 through V3, respectively, but the present invention is not limited thereto. For example, the number of subpixels SPX overlapped by one lens LS, the number of view images, and the number of view areas may vary according to the size of the display device 1, which provides a stereoscopic image and a viewing angle control image, and the like.

Figure 4:
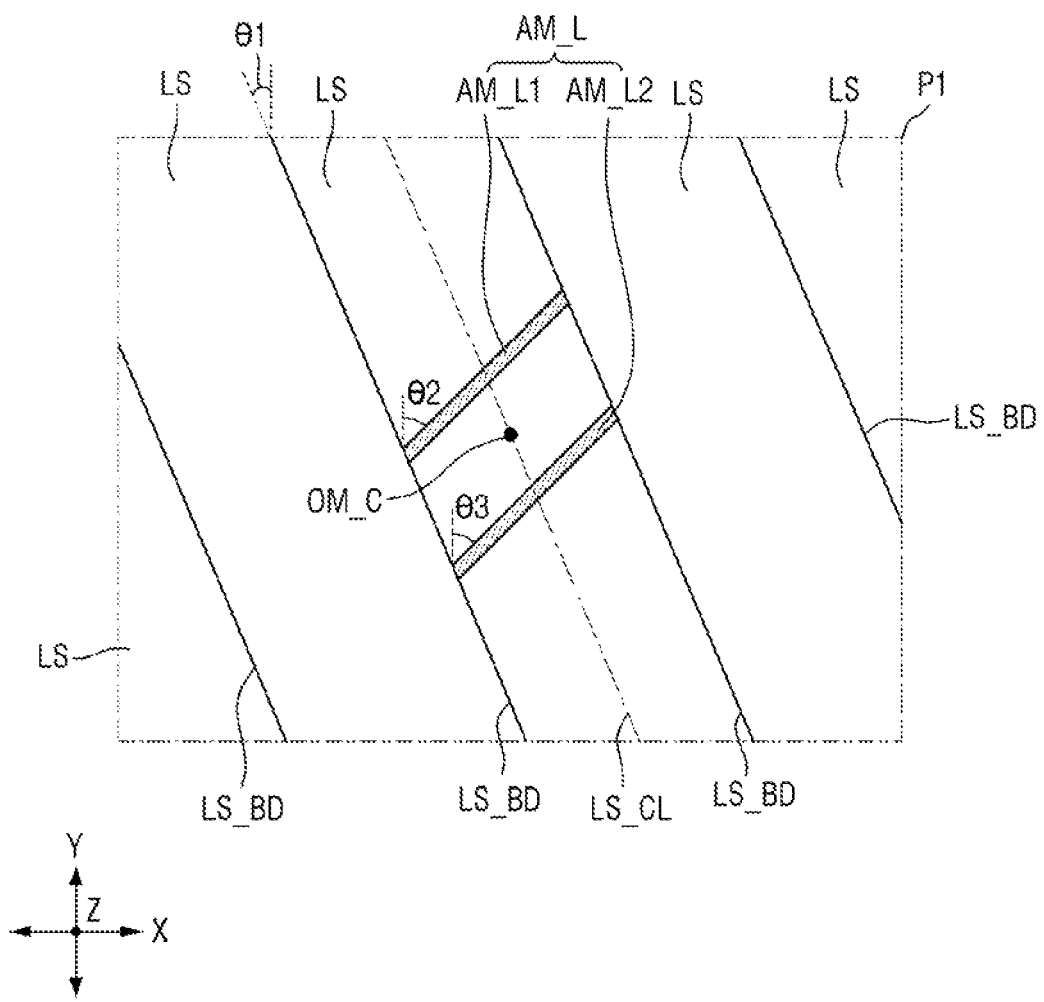
FIG. 4 is a plan view of an optical member in part 'P1' of FIG. 1.
Figure 5:
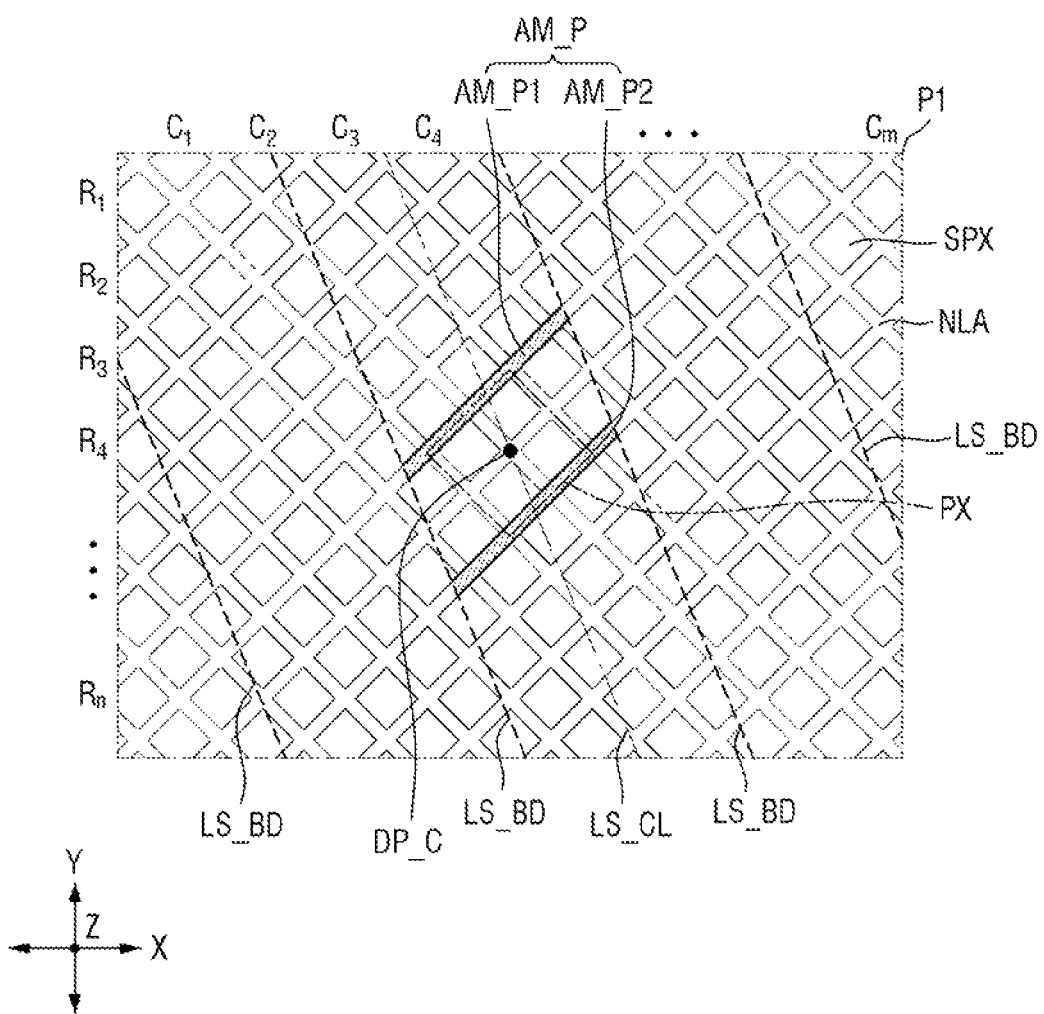
FIG. 5 is a plan view of a display panel in part 'P1' of FIG. 1.

FIG. 4 is a plan view of the optical member OM in part 'P1' of FIG. 1. FIG. 5 is a plan view of the display panel DP in part 'P1' of FIG. 1.

Referring to FIGS. 1, 2 and 4, as described above, each of the lenses LS may extend in one direction intersecting the first direction X and the second direction Y in a plan view. The lenses LS may be arranged in the other direction intersecting and/or orthogonal to the one direction in a plan view. The one direction and the other direction may be referred to as the fourth direction and the fifth direction, respectively. For example, in FIG. 4, the one direction may be a direction from an upper left corner to a lower right corner, and the other direction may be a direction from a lower left corner to an upper right corner.

Each of the lenses LS may be inclined at the first angle θ1 with respect to the second direction Y. For example, the first angle θ1 may be an acute angle formed by an axis in the second direction Y and each of a plurality of lens boundaries LS_BD. For example, the first angle θ1 may be, but is not limited to, greater than about 0 degrees and less than about 45 degrees.

The first alignment mark AM_L may be located at the center OM_C of the optical member OM or located adjacent to the center OM_C of the optical member OM.

For example, the first alignment mark AM_L may overlap a lens LS passing through the center OM_C of the optical member OM (e.g., overlapping the center OM_C of the optical member OM) among the lenses LS. For example, referring further to FIGS. 1 and 2, the center OM_C of the optical member OM may be spaced apart from both sides of the optical member OM extending in the first direction X by equal distances in the second direction Y and may be spaced apart from both sides of the optical member OM extending in the second direction Y by equal distances in the first direction X. For example, the center OM_C of the optical member OM may be at an intersection of a virtual line that extends in the first direction X and bisects both sides of the optical member OM extending in the second direction Y and another virtual line that extends in the second direction Y and bisects both sides of the optical member OM extending in the first direction X. However, the position of the center OM_C of the optical member OM is not limited thereto and may vary according to the design of the optical member OM. The center OM_C of the optical member OM may also be a point overlapping the center DP_C of the display panel DP to be described later in a plan view.

The center OM_C of the optical member OM may be located on a lens centerline LS_CL bisecting, in the one direction, the lens LS in which the center OM_C of the optical member OM is located in a plan view. The lens centerline LS_CL may extend parallel to the lens boundaries LS_BD and may be spaced apart from neighboring lens boundaries LS_BD by equal distances, for example, about ½ of a pitch of the lens LS.

The first alignment mark AM_L may include a first sub-alignment mark AM_L1 and a second sub-alignment mark AM_L2.

The first sub-alignment mark AM_L1 and the second sub-alignment mark AM_L2 may be disposed adjacent to the center OM_C of the optical member OM. The first sub-alignment mark AM_L1 and the second sub-alignment mark AM_L2 may be separated from each other. In an embodiment of the present invention, the first sub-alignment mark AM_L1 and the second sub-alignment mark AM_L2 may be spaced apart from the center OM_C of the optical member OM by equal distances in a plan view and may be disposed symmetrically with respect to the center OM_C of the optical member OM. The distances may be distances in the first direction X, distances in the second direction Y, and/or distances in a direction in which the lenses LS extend. In this case, the center OM_C of the optical member OM may be located between the first sub-alignment mark AM_L1 and the second sub-alignment mark AM_L2. However, the present invention is not limited thereto, and the first sub-alignment mark AM_L1 and the second sub-alignment mark AM_L2 may overlap the center OM_C of the optical member OM, or the first sub-alignment mark AM_L1 and the second sub-alignment mark AM_L2 may be disposed asymmetrically with respect to the center OM_C of the optical member OM.

Each of the first sub-alignment mark AM_L1 and the second sub-alignment mark AM_L2 may extend in a direction intersecting the direction in which the lenses LS (the lens boundaries LS_BD and/or the lens centerline LS_CL) extend. The first sub-alignment mark AM_L1 may be inclined at the second angle θ2 with respect to the second direction Y and may be inclined at the third angle θ3 with respect to the second direction Y. The second angle θ2 may be an acute angle formed by an axis in the second direction Y and a boundary of the first sub-alignment mark AM_L1 crossing the lens centerline LS_CL, and the third angle θ3 may be an acute angle formed by an axis in the second direction Y and a boundary of the second sub-alignment mark AM_L2 crossing the lens centerline LS_CL. In an embodiment of the present invention, the second angle θ2 and the third angle θ3 may be substantially equal to each other, but the present invention is not limited thereto.

The second angle θ2 and the third angle θ3 may be angles measured in a different measurement direction (e.g., a rotation direction) from the first angle θ1 based on the second direction Y. For example, the second angle θ2 and the third angle θ3 may be angles measured in a clockwise direction from the second direction Y, and the first angle θ1 may be an angle measured in a counterclockwise direction from the second direction Y.

The second angle θ2 and the third angle θ3 may be equal to or greater than the first angle θ1. For example, the second angle θ2 and the third angle θ3 may be, but are not limited to, about 45 degrees.

Both ends of each of the first sub-alignment mark AM_L1 and the second sub-alignment mark AM_L2 may be respectively aligned with two lens boundaries LS_BD of the lens LS passing through the center OM_C of the optical member OM in a plan view. For example, both ends of each of the first sub-alignment mark AM_L1 and the second sub-alignment mark AM_L2 may respectively overlap the two lens boundaries LS_BD of the lens LS passing through the center OM_C of the optical member OM in a plan view. However, the present invention is not limited thereto. The first sub-alignment mark AM_L1 and the second sub-alignment mark AM_L2 may be disposed within the lens LS passing through the center OM_C of the optical member OM in a plan view or may extend to at least one lens LS neighboring the lens LS passing through the center OM_C of the optical member OM. For example, the first sub-alignment mark AM_L1 and the second sub-alignment mark AM_L2 may be disposed between the two lens boundaries LS_BD. As an additional example, the first sub-alignment mark AM_L1 and/or the second sub-alignment mark AM_L2 may extend to overlap at least one lens LS adjacent to the lens LS passing through the center OM_C of the optical member OM.

Referring to FIG. 5, as described above, the display panel DP may include a plurality of subpixels SPX. Each of the subpixels SPX may be, but is not limited to, any one of the first subpixel SPX1, the second subpixel SPX2, and the third subpixel SPX3 of FIG. 3.

Each of the subpixels SPX may have a roughly rhombus shape in a plan view. However, the shape of each of the subpixels SPX is not limited thereto, and each of the subpixels SPX may also have various shapes such as a rectangle, a square, a polygon, a circle, and an ellipse in a plan view.

The subpixels SPX may be arranged in a matrix shape in a plan view. In an embodiment of the present invention, a plurality of rows R1 through Rn may extend in the first direction X, and a plurality of columns C1 through Cm may extend in the second direction Y. As illustrated in FIG. 5, subpixels SPX forming the rows R1 through Rn and subpixels SPX forming the columns C1 through Cm may not overlap each other, and the subpixels SPX forming the rows R1 through Rn (the columns C1 through Cm) may be disposed between the subpixels SPX forming the columns C1 through Cm (the rows R1 through Rn). In this case, for example, one subpixel SPX of the subpixels SPX forming the rows R1 through Rn may be at least partially surrounded by adjacent subpixels SPX of the subpixels SPX forming the columns C1 through Cm.

A non-emission area NLA having a lattice shape may be disposed between the subpixels SPX that emit light. As illustrated in FIG. 5, the non-emission area NLA may be disposed between the subpixels SPX in a plan view but may form a lattice (e.g., net)-shaped pattern. For example, the lattice-shaped pattern of the non-emission area NLA may be formed through intersections of a plurality of stripes extending in different diagonal directions, for example, extending from an upper left corner to a lower right corner of FIG. 5 or extending from an upper right corner to a lower left corner of FIG. 5. A light blocking material (or, e.g., a light absorbing material) such as a black matrix may be disposed in the non-emission area NLA. In this case, the first alignment mark AM_L and/or the second alignment mark AM_P may overlap the light blocking material in the thickness direction.

The second alignment mark AM_P may be disposed between a plurality of subpixels SPX. The second alignment mark AM_P may be disposed in the non-emission area NLA. The second alignment mark AM_P may be overlapped by the first alignment mark AM_L in the thickness direction. The second alignment mark AM_P may be disposed between subpixels SPX which are overlapped in the thickness direction by a lens LS passing through the center DP_C of the display panel DP, on which the first alignment mark AM_L is disposed.

The second alignment mark AM_P may include a third sub-alignment mark AM_P1 and a fourth sub-alignment mark AM_P2.

The third sub-alignment mark AM_P1 and the fourth sub-alignment mark AM_P2 may be disposed adjacent to the center DPC of the display panel DP. The third sub-alignment mark AM_P1 and the fourth sub-alignment mark AM_P2 may be separated from each other. In an embodiment of the present invention, the third sub-alignment mark AM_P1 and the fourth sub-alignment mark AM_P2 may be spaced apart from the center DP_C of the display panel DP by equal distances in a plan view, and may be disposed symmetrically with respect to the center DP_C of the display panel DP. The distances by which the third sub-alignment mark AM_P1 and the fourth sub-alignment mark AM_P2 are spaced apart from the center DP_C of the display panel DP may be distances in the first direction X, distances in the second direction Y, and/or distances in the direction in which the lenses LS extend. In this case, the center DP_C of the display panel DP may be located between the third sub-alignment mark AM_P1 and the fourth sub-alignment mark AM_P2. However, the present invention is not limited thereto, and the third sub-alignment mark AM_P1 and the fourth sub-alignment mark AM_P2 may overlap the center DP_C of the display panel DP, or the third sub-alignment mark AM_P1 and the fourth sub-alignment mark AM_P2 may be disposed asymmetrically with respect to the center DP_C of the display panel DP.

For example, as illustrated in FIG. 2, the center DP_C of the display panel DP may be spaced apart from both sides of the display panel DP extending in the first direction X by equal distances in the second direction Y and may be spaced apart from both sides of the display panel DP extending in the second direction Y by equal distances in the first direction X. For example, the center DP_C of the display panel DP may be at an intersection of a virtual line that extends in the first direction X and bisects both sides of the display panel DP extending in the second direction Y and another virtual line that extends in the second direction Y and bisects both sides of the display panel DP extending in the first direction X. For another example, the center DPC of the display panel DP may be located at an intersection of a $((n+1)/2)^{th}$ row among the n rows R1 through Rn and a $(m+1)/2)^{th}$ column among the m columns C1 through Cm. For another example, the center DP_C of the display panel DP may be a center of the active area AA. In this case, the center of the active area AA may be based on the edges of the active area AA in substantially the same or similar way as the center DP_C of the display panel DP. However, the position of the center DP_C of the display panel DP is not limited thereto and may vary according to the design of the display panel DP.

Referring to FIGS. 2, 4 and 5, the first sub-alignment mark AM_L1 may overlap the third sub-alignment mark AM_P1 in the thickness direction, and the second sub-alignment mark AM_L2 may overlap the fourth sub-alignment mark AM_P2 in the thickness direction.

The third sub-alignment mark AM_P1 and the fourth sub-alignment mark AM_P2 may have substantially the same size as the first sub-alignment mark AM_L1 and the second sub-alignment mark AM_L2, respectively. However, the present invention is not limited thereto, and for example, the third sub-alignment mark AM_P1 and the fourth sub-alignment mark AM_P2 may be larger or smaller than the first sub-alignment mark AM_L1 and the second sub-alignment mark AM_L2 in a plan view, respectively.

The third sub-alignment mark AM_P1 and the fourth sub-alignment mark AM_P2 may be overlapped by the lens centerline LS_CL in the thickness direction in a plan view. Both ends of each of the third sub-alignment mark AM_P1 and the fourth sub-alignment mark AM_P2 may be respectively aligned with the two lens boundaries LS_BD of the lens LS so that both ends of each of the third sub-alignment mark AM_P1 and the fourth sub-alignment mark AM_P2 may respectively overlap in the thickness direction the two lens boundaries LS_BD passing through the center OM_C of the optical member OM in a plan view. However, the present invention is not limited thereto. For example, the third sub-alignment mark AM_P1 and the fourth sub-alignment mark AM_P2 may be disposed within the lens LS passing through the center OM_C of the optical member OM in a plan view or may extend to at least one lens LS neighboring the lens LS passing through the center OM_C of the optical member OM. For example, the third sub-alignment mark AM_P1 and the fourth sub-alignment mark AM_P2 may be disposed between the two lens boundaries LS_BD. As an additional example, the third sub-alignment mark AM_P1 and/or the fourth sub-alignment mark AM_P2 may extend to overlap at least one lens LS adjacent to the lens LS passing through the center OM_C of the optical member OM.

Each of the third sub-alignment mark AM_P1 and the fourth sub-alignment mark AM_P2 may extend in a direction intersecting the directions in which the columns C1 through Cm and the rows R1 through Rn of the subpixels SPX extend. Each of the third sub-alignment mark AM_P1 and the fourth sub-alignment mark AM_P2 may extend in a direction intersecting the direction in which the lenses LS (the lens boundaries LS_BD and/or the lens centerline LS_CL) extend.

The third sub-alignment mark AM_P1 may be inclined at substantially the same angle as the first sub-alignment mark AM_L1 with respect to the second direction Y, and the fourth sub-alignment mark AM_P2 may be inclined at substantially the same angle as the second sub-alignment mark AM_L2 with respect to the second direction Y. Referring to FIGS. 4 and 5, the third sub-alignment mark AM_P1, like the first sub-alignment mark AM_L1, may be inclined at the second angle θ2 with respect to the second direction Y, and the fourth sub-alignment mark AM_P2, like the second sub-alignment mark AM_L2, may be inclined at the third angle θ3 with respect to the second direction Y. For example, each of the third sub-alignment mark AM_P1 and the fourth sub-alignment mark AM_P2 may be inclined at about 45 degrees with to the second direction Y. However, the present invention is not limited thereto, and the third sub-alignment mark AM_P1 and/or the fourth sub-alignment mark AM_P2 may be disposed at a different angle from the first sub-alignment mark AM_L1 and/or the second sub-alignment mark AM_L2 to the second direction Y.

The third sub-alignment mark AM_P1 and the fourth sub-alignment mark AM_P2 may be disposed in parts of the non-emission area NLA which form the boundary of a pixel PX. For example, as illustrated in FIG. 5, one pixel PX may include a plurality of subpixels SPX, and the third sub-alignment mark AM_P1 and the fourth sub-alignment mark AM_P2 may be disposed to overlap parts of the non-emission area NLA which form the boundary of the pixel PX. However, the present invention is not limited thereto, and the third sub-alignment mark AM_P1 and the fourth sub-alignment mark AM_P2 may be disposed between subpixels SPX forming one pixel PX.

Referring to FIGS. 2, 4 and 5, as described above, the first alignment mark AM_L and the second alignment mark AM_P may overlap each other in the thickness direction. The first sub-alignment mark AM_L1 may overlap the third sub-alignment mark AM_P1 in the thickness direction, and the second sub-alignment mark AM_L2 may overlap the fourth sub-alignment mark AM_P2 in the thickness direction.

The polarities of the first alignment mark AM_L and the second alignment mark AM_P may be disposed such that a mutual attractive force occurs. For example, both the first sub-alignment mark AM_L1 and the second sub-alignment mark AM_L2 may have the polarity of an N pole (or an S pole), and both the third sub-alignment mark AM_P1 and the fourth sub-alignment mark AM_P2 may have the polarity of the S pole (or the N pole). For another example, the first sub-alignment mark AM_L1 and the third sub-alignment mark AM_P1 may have the polarity of the N pole (or the S pole), and the second sub-alignment mark AM_L2 and the fourth sub-alignment mark AM_P2 may have the polarity of the S pole (or the N pole).

Since the display device 1 according to the embodiment includes the first alignment mark AM_L, which overlaps a lens LS, and the second alignment mark AM_P, which is disposed between a plurality of subpixels, a process can be simplified when compared with a conventional alignment method using an optical pattern. In addition, loss of the active area AA of the display panel DP due to the placement of the alignment marks can be minimized, and high alignment accuracy can be obtained.

Figure 6:
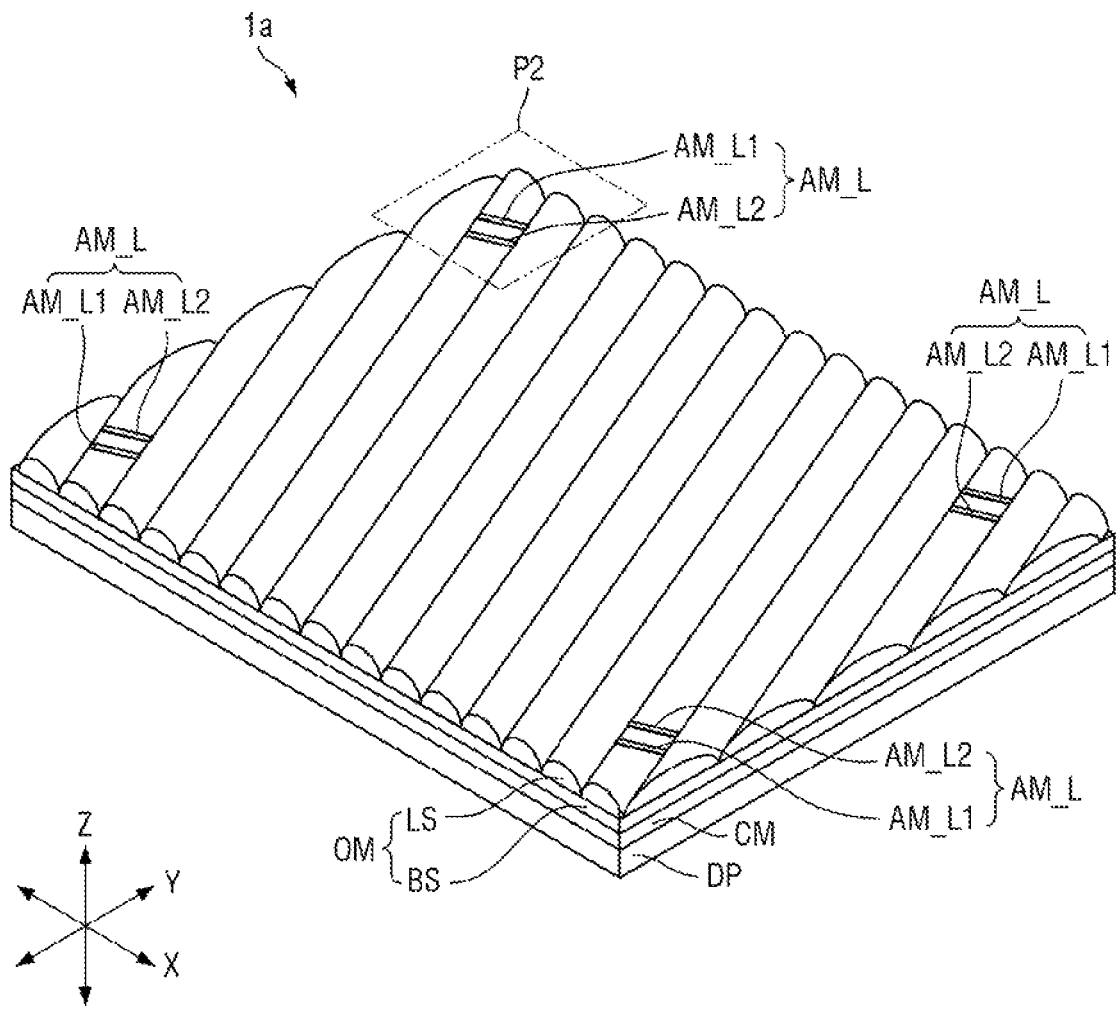
FIG. 6 is a perspective view of a display device according to an embodiment of the present invention.
Figure 7:
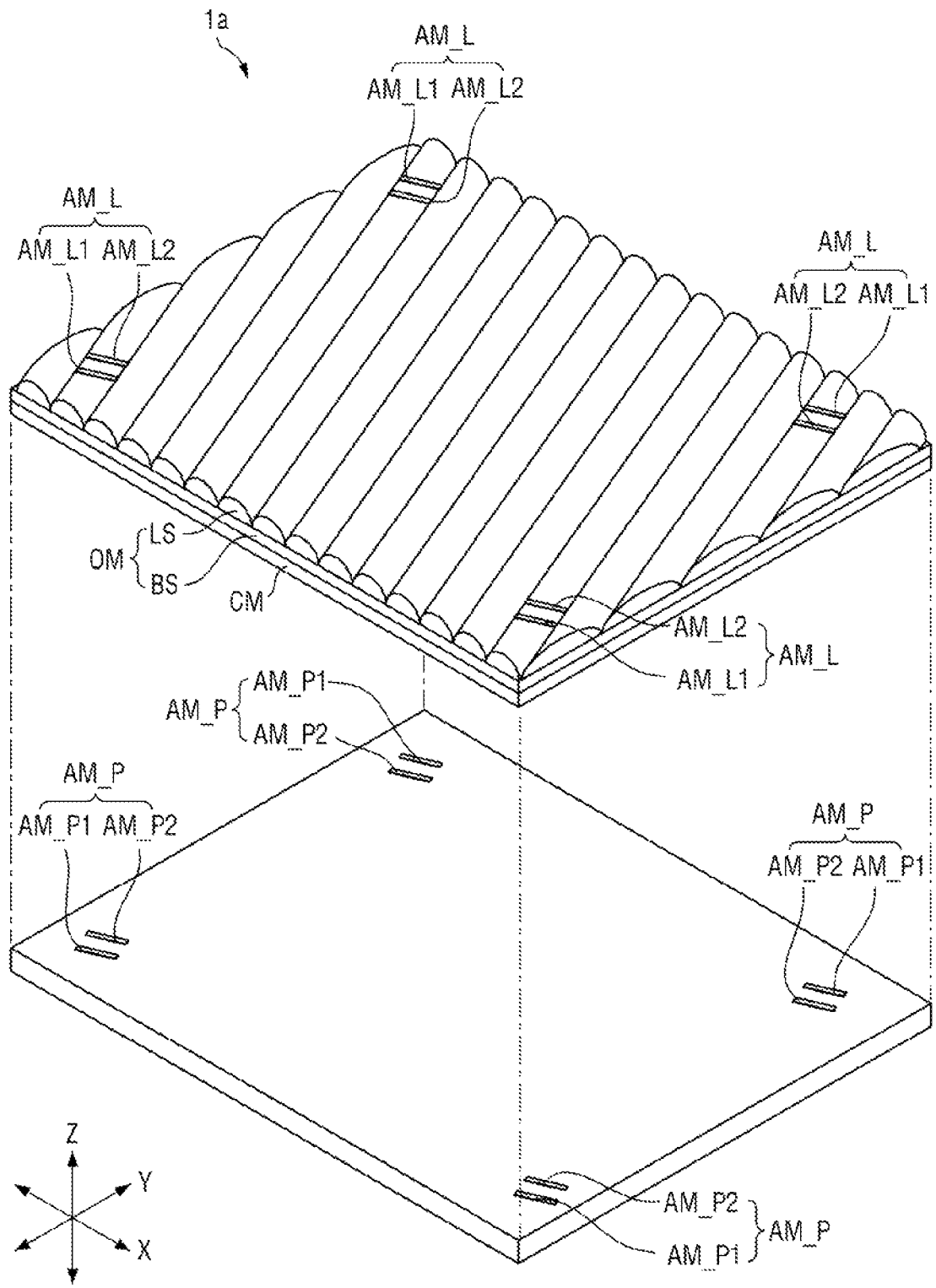
FIG. 7 is an exploded perspective view of the display device according to an embodiment of the present invention.
Figure 8:
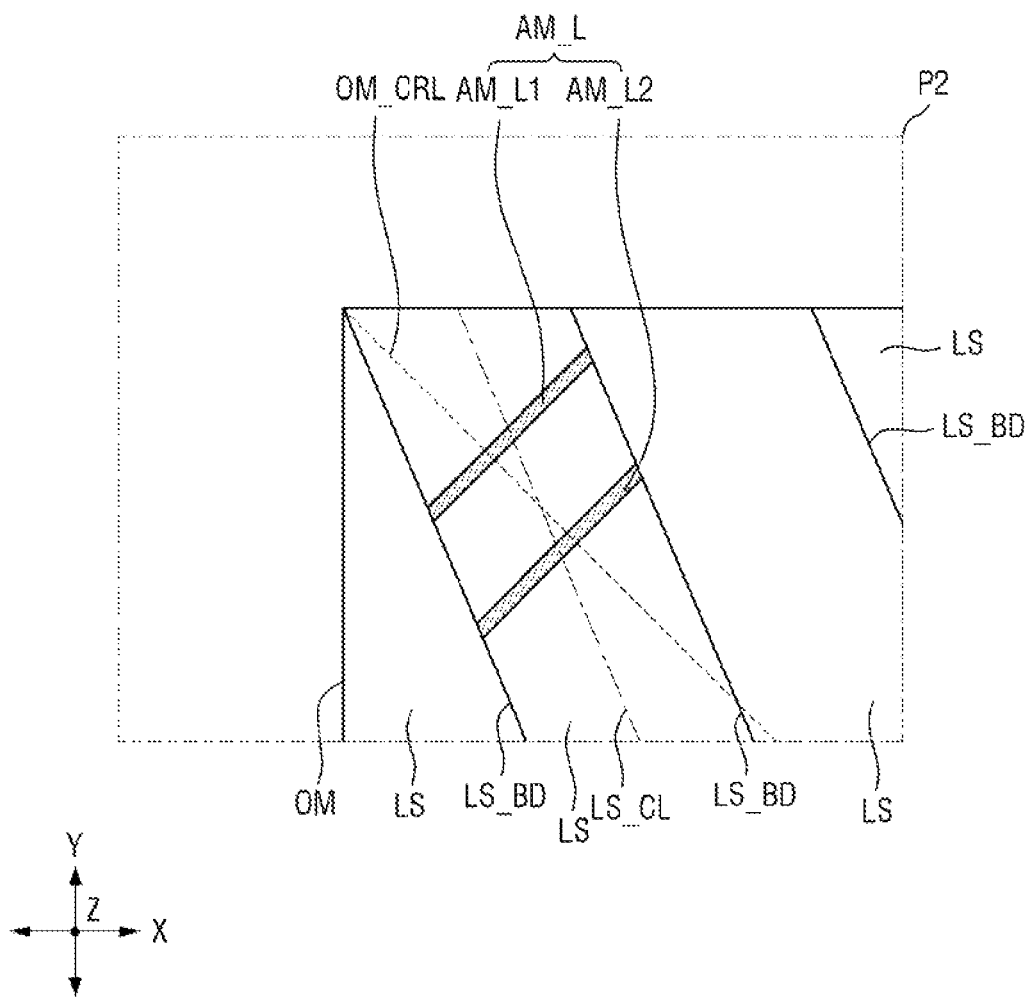
FIG. 8 is a plan view of an optical member in part 'P2' of FIG. 6.
Figure 9:
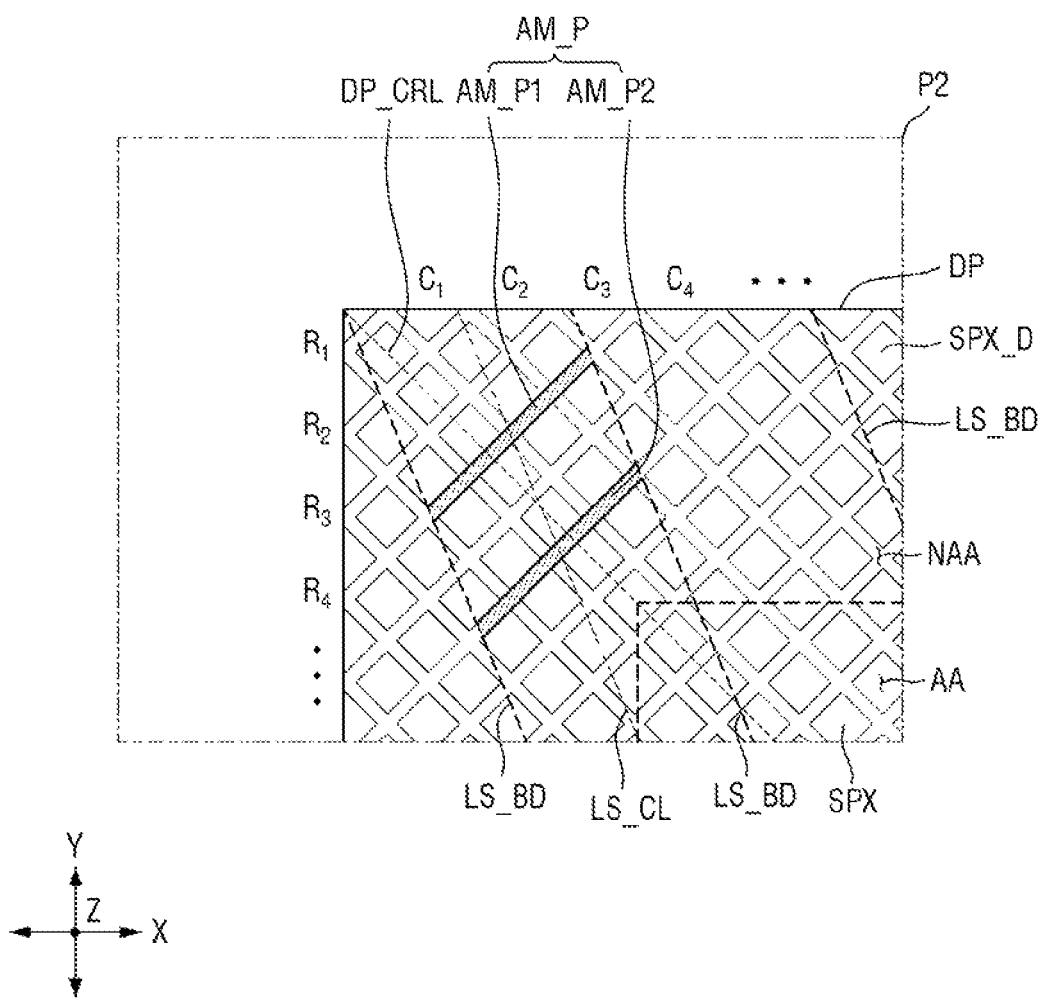
FIG. 9 is a plan view of a display panel in part 'P2' of FIG. 6.

FIG. 6 is a perspective view of a display device according to an embodiment of the present invention. FIG. 7 is an exploded perspective view of the display device according to an embodiment of the present invention. FIG. 8 is a plan view of an optical member OM in part 'P2' of FIG. 6. FIG. 9 is a plan view of a display panel DP in part 'P2' of FIG. 6.

Referring to FIGS. 6 and 7, a first alignment mark AM_L and a second alignment mark AM_P may be disposed at a corner of the display device 1a, unlike in the embodiment of FIGS. 1 through 5. The corner of the display device 1a may include a corner, which is formed when a side in the first direction X and a side in the second direction Y meet in a plan view, and a part (or, e.g., area) adjacent to the corner.

In an embodiment of the present invention, as illustrated in FIGS. 6 and 7, four first alignment marks AM_L are disposed at four corners of the optical member OM, respectively, and four second alignment marks AM_P overlapped by the four first alignment marks AM_L in the thickness direction may be disposed at four corners of the display panel DP, respectively. However, the present invention is not limited thereto. For example, the first alignment mark AM_L and the second alignment mark AM_P may also be disposed at two or more corners of the optical member OM or at two or more corners of the display panel DP, and at least one of the first alignment marks AM_L and at least one of the second alignment marks AM_P may also be disposed at a center OM_C of the optical member OM and/or a center DP_C of the display panel DP.

The first alignment mark AM_L and the second alignment mark AM_P disposed at an upper left corner of FIGS. 6 and 7 among the corners of the display device 1a will now be mainly described. The first alignment marks AM_L and the second alignment marks AM_P disposed at a lower left corner, an upper right corner and a lower right corner of FIGS. 6 and 7 may be disposed in substantially the same or similar manner as the first alignment mark AM_L and the second alignment mark AM_P disposed at the upper left corner.

Referring to FIG. 8, the first sub-alignment mark AM_L1 and the second sub-alignment mark AM_L2 may overlap a lens LS disposed adjacent to a corner of the optical member OM. For example, in a plan view, the first sub-alignment mark AM_L1 and the second sub-alignment mark AM_L2 may overlap a centerline LS_CL of the lens LS disposed adjacent to the corner of the optical member OM. For example, the first alignment mark AM_L may overlap the centerline LS_CL of a lens LS disposed closest to the corner of the optical member OM among a plurality of lenses LS disposed adjacent to the corner of the optical member OM. In this case, ends of the first sub-alignment mark AM_L1 and the second sub-alignment mark AM_L2 may be aligned with lens boundaries LS_BD in a plan view, but the present invention is not limited thereto. For example, the first sub-alignment mark AM_L1 and the second sub-alignment mark AM_L2 may be located only within the lens LS or may extend to overlap another lens LS neighboring (or, e.g., immediately adjacent to) the lens LS.

The first sub-alignment mark AM_L1 and the second sub-alignment mark AM_L2 may overlap a centerline OM_CRL of the corner of the optical member OM in a plan view. Referring further to FIGS. 2 and 4, for example, the centerline OM_CRL of the corner of the optical member OM may be a virtual line passing through a tip of one corner of the optical member OM and a tip of another corner of the optical member OM which is located on an opposite side of the center OM_C of the optical member OM. In this case, the centerline OM_CRL of the corner may pass through the center OM_C of the optical member OM. For another example, the centerline OM_CRL of the corner of the optical member OM may be a virtual line bisecting an internal angle of the corner of the optical member OM which faces the center OM_C of the optical member OM.

The centerline OM_CRL of the corner of the optical member OM may overlap the lens centerline LS_CL. For example, the centerline OM_CRL of the corner of the optical member OM may cross the lens centerline LS_CL. The first sub-alignment mark AM_L1 and the second sub-alignment mark AM_L2 may be disposed adjacent to an intersection of the centerline OM_CRL of the corner and the lens centerline LS_CL in a plan view. In an embodiment of the present invention, the first sub-alignment mark AM_L1 and the second sub-alignment mark AM_L2 may be disposed symmetrically with respect to the intersection of the centerline OM_CRL of the corner and the lens centerline LS_CL. Further, the intersection of the centerline OM_CRL of the corner and the lens centerline LS_CL may be between the first sub-alignment mark AM_L1 and the second sub-alignment mark AM_L2 in a plan view. However, the present invention is not limited thereto.

The first sub-alignment mark AM_L1 and the second sub-alignment mark AM_L2 may be inclined in a direction intersecting the first direction X, the second direction Y and a direction in which the lenses LS extend and may extend in the direction intersecting the above directions. The first sub-alignment mark AM_L1 and the second sub-alignment mark AM_L2 may be disposed to have substantially the same or similar angle, size and area as those of the embodiment of FIG. 4.

Referring to FIG. 9, the display panel DP may include a plurality of dead pixels disposed in a non-active area NAA. The dead pixels may be subpixels SPX disposed in the non-active area NAA among a plurality of subpixels SPX. The dead pixels may be disposed in the non-active area NAA in substantially the same or similar manner as the subpixels SPX disposed in an active area AA.

The second alignment mark AM_P may be disposed between a plurality of dead pixels. However, the present invention is not limited thereto, and for example, the second alignment mark AM_P may be disposed between the subpixels SPX disposed in the active area AA or may be disposed across the non-active area NAA and the active area AA. For example, the second alignment mark AM_P may be between the subpixels SPX of the active area AA and between the dead pixels of the non-active area NAA.

A third sub-alignment mark AM_P1 and a fourth sub-alignment mark AM_P2 may overlap a centerline DP_CRL of a corner of the display panel DP in a plan view. The centerline DP_CRL of the corner of the display panel DP may be overlapped by the centerline OM_CRL of the corner of the optical member OM, but the present invention is not limited thereto.

Referring further to FIGS. 7 and 9, for example, the centerline DP_CRL of the corner of the display panel DP may be a virtual line passing through a tip of one corner of the display panel DP and a tip of another corner of the display panel DP which is located on an opposite side of the center DP_C of the display panel DP. In this case, the centerline DP_CRL of the corner may pass through the center DP_C of the display panel DP. For another example, the centerline DP_CRL of the corner of the display panel DP may be a virtual line bisecting an internal angle of the corner of the display panel DP which faces the center DP_C of the display panel DP.

The centerline DP_CRL of the corner of the display panel DP may be overlapped by the lens centerline LS_CL. For example, the centerline DP_CRL of the corner of the display panel DP may cross the lens centerline LS_CL. The third sub-alignment mark AM_P1 and the fourth sub-alignment mark AM_P2 may be disposed adjacent to an intersection of the centerline DP_CRL of the corner of the display panel DP and the lens centerline LS_CL in a plan view. In an embodiment of the present invention, the third sub-alignment mark AM_P1 and the fourth sub-alignment mark AM_P2 may be disposed symmetrically with respect to the intersection of the centerline DP_CRL of the corner of the display panel DP and the lens centerline LS_CL. For example, the intersection of the centerline DP_CRL of the corner of the display panel DP and the lens centerline LS_CL may be between the third sub-alignment mark AM_P1 and the fourth sub-alignment mark AM_P2 in a plan view. However, the present invention is not limited thereto.

The third sub-alignment mark AM_P1 and the fourth sub-alignment mark AM_P2 may be inclined in a direction intersecting the first direction X, the second direction Y and the direction in which the lenses LS extend and may extend in the direction intersecting the above directions. The third sub-alignment mark AM_P1 and the fourth sub-alignment mark AM_P2 may be disposed to have substantially the same or similar angle, size and area as those of the embodiment of FIG. 5.

Referring to FIGS. 6 through 9, the first sub-alignment mark AM_L1 may overlap the third sub-alignment mark AM_P1 in the thickness direction, and the second sub-alignment mark AM_L2 may overlap the fourth sub-alignment mark AM_P2 in the thickness direction. Polarities of the first sub-alignment mark AM_L1, the second sub-alignment mark AM_L2, the third sub-alignment mark AM_P1, and the fourth sub-alignment mark AM_P2 are as described above with reference to FIGS. 4 and 5.

The embodiment of FIGS. 6 through 9 is substantially the same as or similar to the embodiment of FIGS. 1 through 5 except for the positions of the first alignment mark AM_L and the second alignment mark AM_P, and thus a redundant description thereof may have been omitted.

Figure 10:
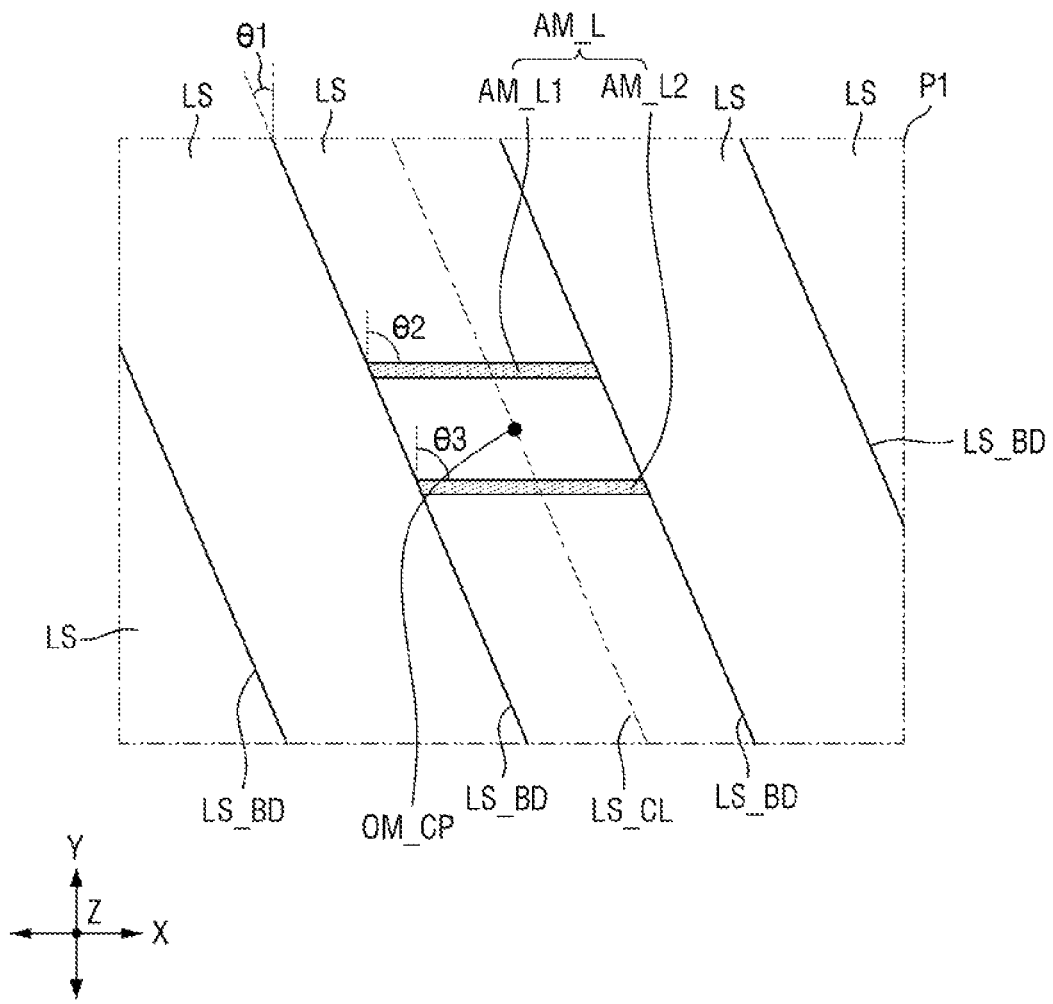
FIG. 10 is a plan view of an optical member according to an embodiment of the present invention.
Figure 11:
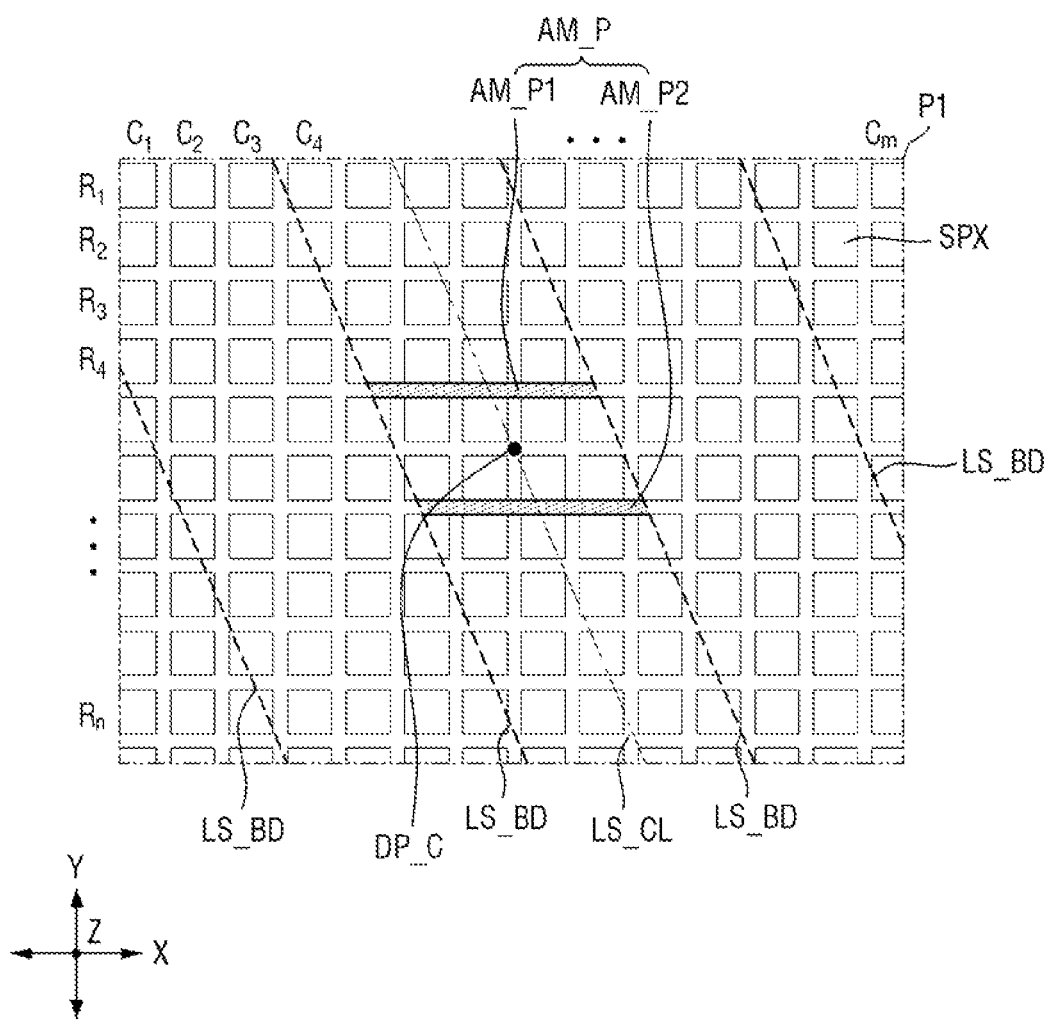
FIG. 11 is a plan view of a display panel according to an embodiment of the present invention.

FIG. 10 is a plan view of an optical member according to an embodiment of the present invention. FIG. 11 is a plan view of a display panel according to an embodiment of the present invention.

Referring to FIGS. 10 and 11, a first sub-alignment mark AM_L1, a second sub-alignment mark AM_L2, a third sub-alignment mark AM_P1, and a fourth sub-alignment mark AM_P2 may extend parallel to the first direction X, unlike in the embodiments of FIGS. 1 through 9.

For example, the first sub-alignment mark AM_L1 and the second sub-alignment mark AM_L2 may overlap the third sub-alignment mark AM_P1 and the fourth sub-alignment mark AM_P2 in the thickness direction, respectively, but the third sub-alignment mark AM_P1 and the fourth sub-alignment mark AM_P2 may be disposed on the display panel DP with a shape corresponding to a shape of a space between a plurality of subpixels SPX.

As illustrated in FIG. 11, each of the subpixels SPX may have a polygonal shape (e.g., a rectangular shape) in a plan view. The subpixels SPX may be arranged to form a plurality of rows R1 through Rn extending in the first direction X and a plurality of columns C1 through Cm extending in the second direction Y. Unlike in FIG. 5, one subpixel SPX may simultaneously form a part of one row and a part of one column. For example, each subpixel SPX may be disposed in a row of the plurality of rows R1 through Rn and a column of the plurality of columns C1 and Cm. In this case, a non-emission area NLA may form, for example, a lattice (or, e.g., net)-shaped pattern through intersection of a plurality of stripes extending in the first direction X and a plurality of stripes extending in the second direction Y.

Referring to FIGS. 10 and 11, each of the first sub-alignment mark AM_L1, the second sub-alignment mark AM_L2, the third sub-alignment mark AM_P1, and the fourth sub-alignment mark AM_P2 may be disposed at about 90 degrees with respect to the second direction Y. For example, each of a second angle θ2 and a third angle 93 may be about 90 degrees.

Figure 12:
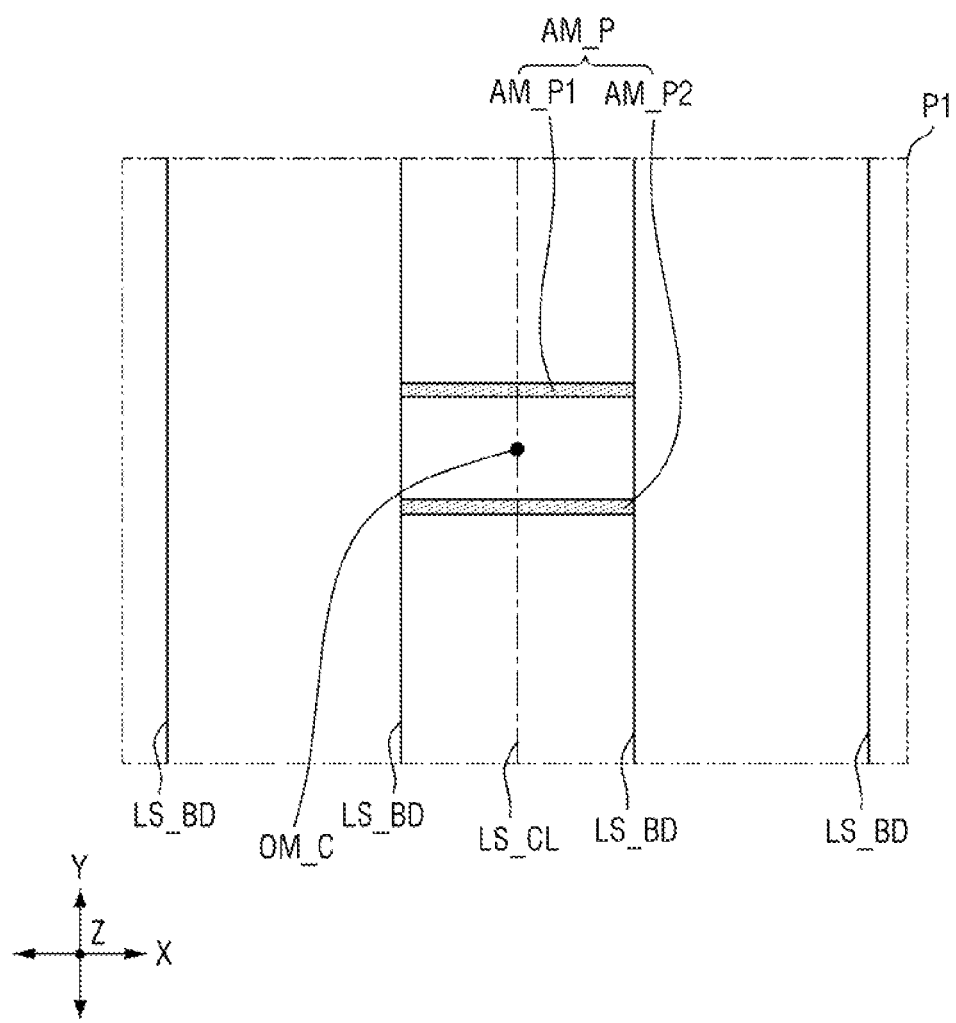
FIG. 12 is a plan view of an optical member according to an embodiment of the present invention.

The embodiment of FIGS. 10 and 12 is substantially the same as or similar to the embodiment of FIGS. 1 through 5 except for the arrangement of the subpixels SPX and the extending direction of the first sub-alignment mark AM_L1, the second sub-alignment mark AM_L2, the third sub-alignment mark AM_P1 and the fourth sub-alignment mark AM_P2, and thus a redundant description thereof will be omitted.

Figure 13:
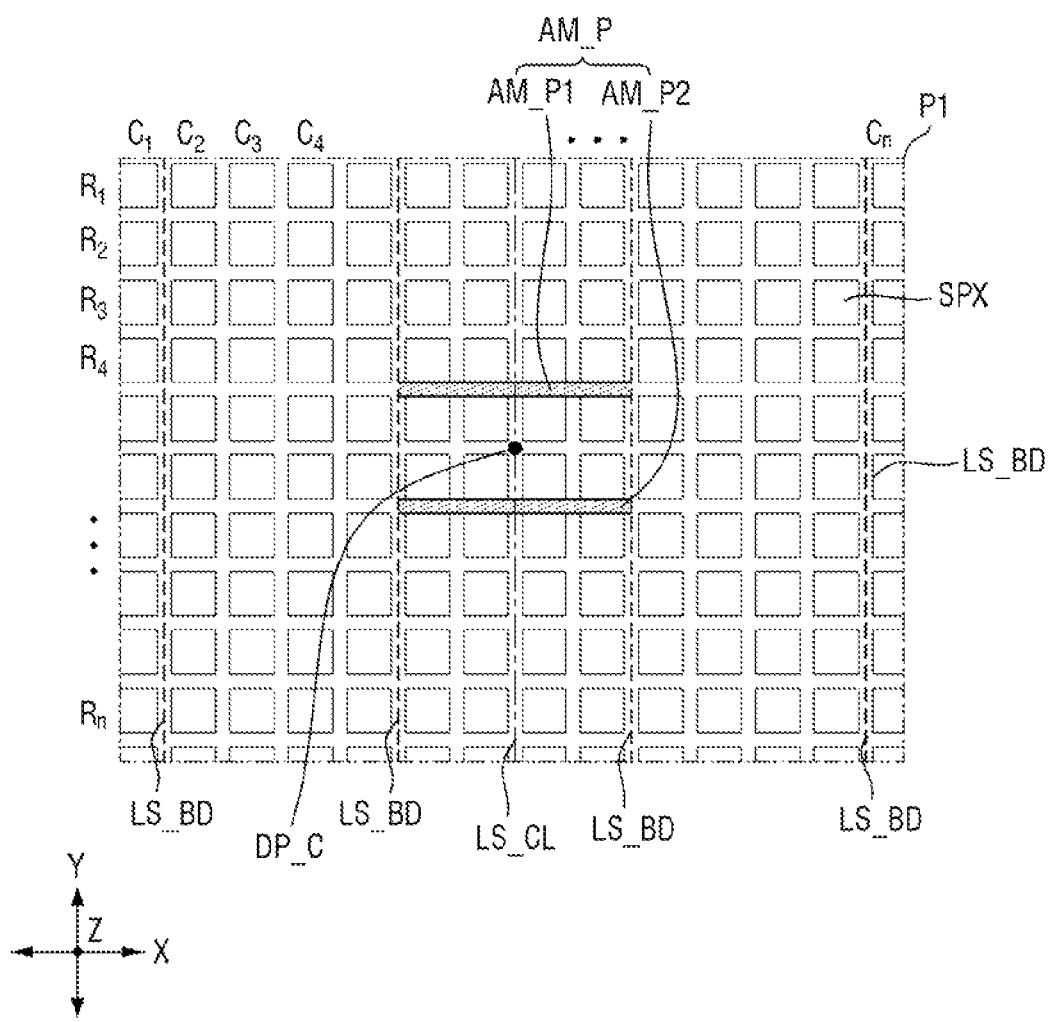
FIG. 13 is a plan view of a display panel according to an embodiment of the present invention.

FIG. 12 is a plan view of an optical member according to an embodiment of the present invention. FIG. 13 is a plan view of a display panel according to an embodiment of the present invention.

Referring to FIGS. 12 and 13, each of a plurality of lenses LS may extend in the second direction Y, unlike in the embodiments of FIGS. 1 through 11. In this case, a plurality of subpixels SPX may be arranged to form a plurality of rows R1 through Rn extending in the first direction X and a plurality of columns C1 through Cm extending in the second direction Y as in FIG. 11, but a non-emission area NLA may form, for example, a lattice (or, e.g., a net)-shaped pattern through intersection of a plurality of stripes extending in the first direction X and a plurality of stripes extending in the second direction Y.

Each of a first sub-alignment mark AM_L1, a second sub-alignment mark AM_L2, a third sub-alignment mark AM_P1, and a fourth sub-alignment mark AM_P2 may extend in the first direction X. Each of the first sub-alignment mark AM_L1, the second sub-alignment mark AM_L2, the third sub-alignment mark AM_P1, and the fourth sub-alignment mark AM_P2 may form an angle of about 90 degrees with a lens centerline LS_CL and lens boundaries LS_BD. In this case, both ends of the first sub-alignment mark AM_L1 and both ends of the second sub-alignment mark AM_L2 may be aligned in the second direction Y, respectively, and both ends of the third sub-alignment mark AM_P1 and both ends of the fourth sub-alignment mark AM_P2 may be aligned in the second direction Y, respectively. However, the present invention is not limited thereto.

The embodiment of FIGS. 12 and 13 is substantially the same as or similar to the embodiment of FIGS. 10 and 11 except for the extending direction of the lenses LS, and thus a redundant description thereof may have been omitted.

Figure 14:
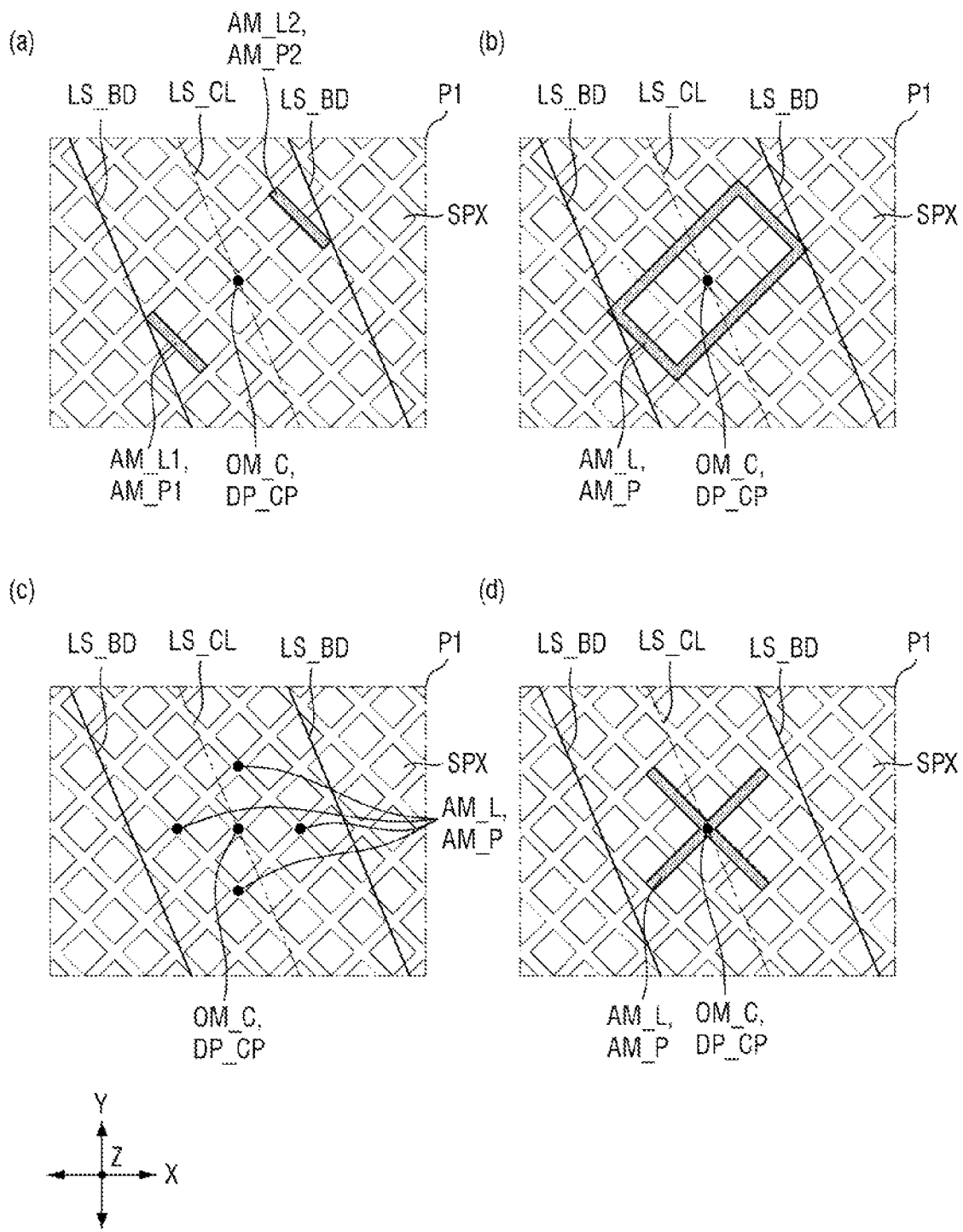
FIG. 14 is a plan view illustrating the arrangement of a first alignment mark and a second alignment mark according to an embodiment of the present invention.

FIG. 14 is a plan view illustrating the arrangement of a first alignment mark AM_L and a second alignment mark AM_P according to an embodiment of the present invention.

Referring to FIGS. 14A through 14D, the first alignment mark AM_L and the second alignment mark AM_P may be disposed in various shapes.

In FIGS. 14A through 14D, for ease of description, a first sub-alignment mark AM_L1 is illustrated as overlapping a third sub-alignment mark AM_P1, and a second sub-alignment mark AM_L2 is illustrated as overlapping a fourth sub-alignment mark AM_P2.

For example, as illustrated in FIG. 14A, the first sub-alignment mark AM_L1, the second sub-alignment mark AM_L2, the third sub-alignment mark AM_P1, and the fourth sub-alignment mark AM_P2 may extend in almost the same direction as a direction in which lens boundaries LS_BD extend. For example, the first sub-alignment mark AM_L1, the second sub-alignment mark AM_L2, the third sub-alignment mark AM_P1, and the fourth sub-alignment mark AM_P2 may be disposed adjacent to both lens boundaries LS_BD but may extend at an angle of about 45 degrees or less with respect to the lens boundaries LS_BD. For example, unlike in the embodiment of FIG. 5, for example, the first sub-alignment mark AM_L1 and the second sub-alignment mark AM_L2 may extend in a diagonal direction extending from an upper left corner to a lower right corner of FIG. 14A.

For another example, as illustrated in FIG. 14B, the first alignment mark AM_L and the second alignment mark AM_P may each have a polygonal shape with an opening in its center region and may surround a center OM_C of an optical member OM and/or a center DP_C of a display panel DP in a plan view. In this case, at least one of a plurality of subpixels SPX may be surrounded by the first alignment mark AM_L and/or the second alignment mark AM_P.

In an embodiment of the present invention, the first alignment mark AM_L and the second alignment mark AM_P may each have an annular shape.

For another example, as illustrated in FIG. 14C, the first alignment mark AM_L and the second alignment mark AM_P may have the shape of a plurality of dots located at a predetermined distance from the center OM_C of the optical member OM and/or the center DP_C of the display panel DP. For example, the plurality of dots may be located at equal distances from the center OM_C of the optical member OM and/or the center DP_C of the display panel DP. As another example, the plurality of dots may be located at different distances from the center OM_C of the optical member OM and/or the center DP_C of the display panel DP. The dots may be located between the lens boundaries LS_BD in a plan view, but the present invention is not limited thereto. For example, at least some of the dots may overlap the lens boundaries LS_BD.

For another example, as illustrated in FIG. 14D, the first alignment mark AM_L and the second alignment mark AM_P may be disposed as a cross shape in a plan view. In this case, the cross shape of each of the first alignment mark AM_L and the second alignment mark AM_P may be located at the center OM_C of the optical member OM and/or the center DP_C of the display panel DP, but the present invention is not limited thereto.

The shapes of the first alignment mark AM_L and the second alignment mark AM_P are not limited to the above examples and may vary according to the design of a display device 1.

Figure 15:
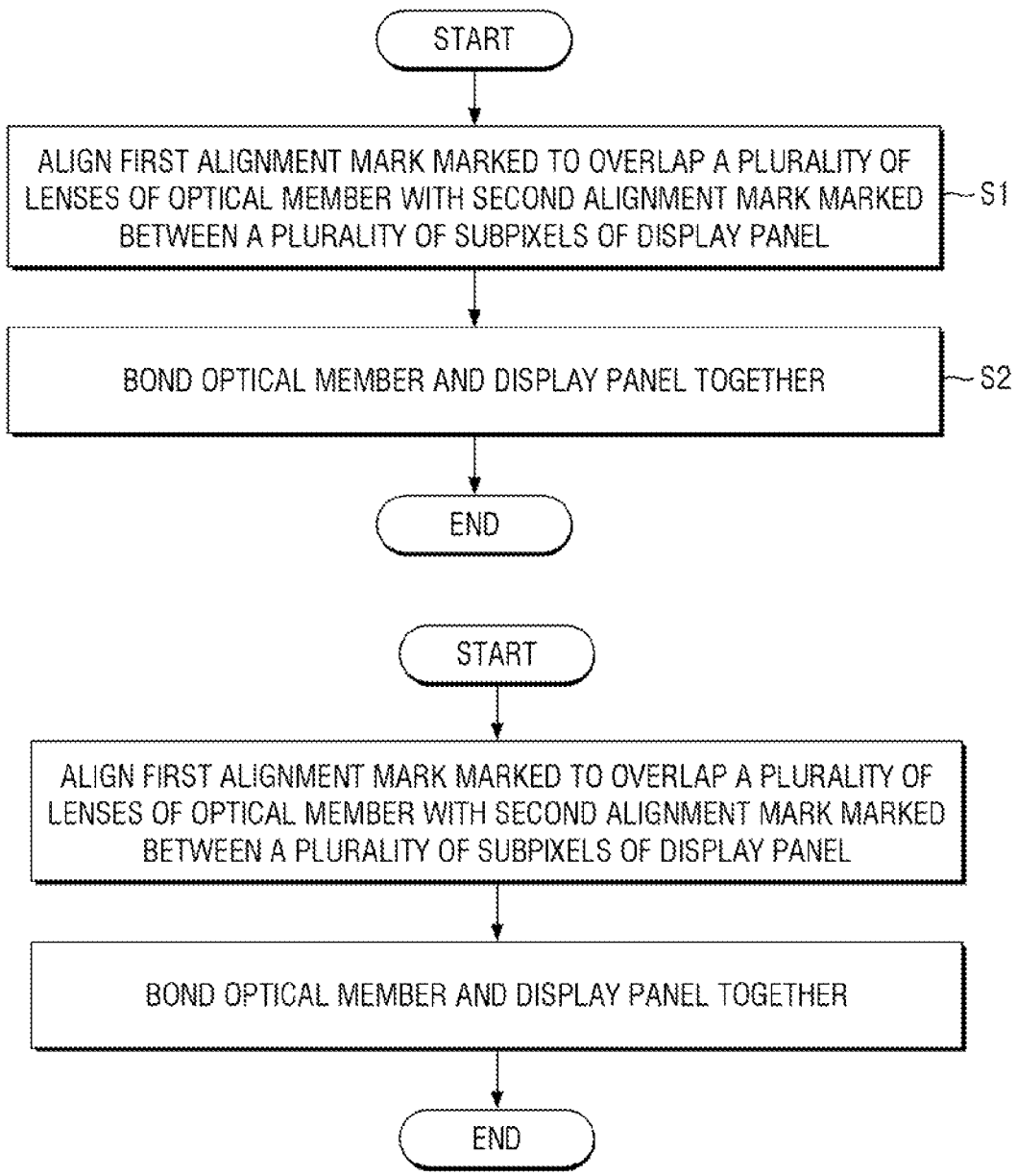
FIG. 15 is a flowchart illustrating a method of manufacturing a display device according to an embodiment of the present invention.
Figure 16:
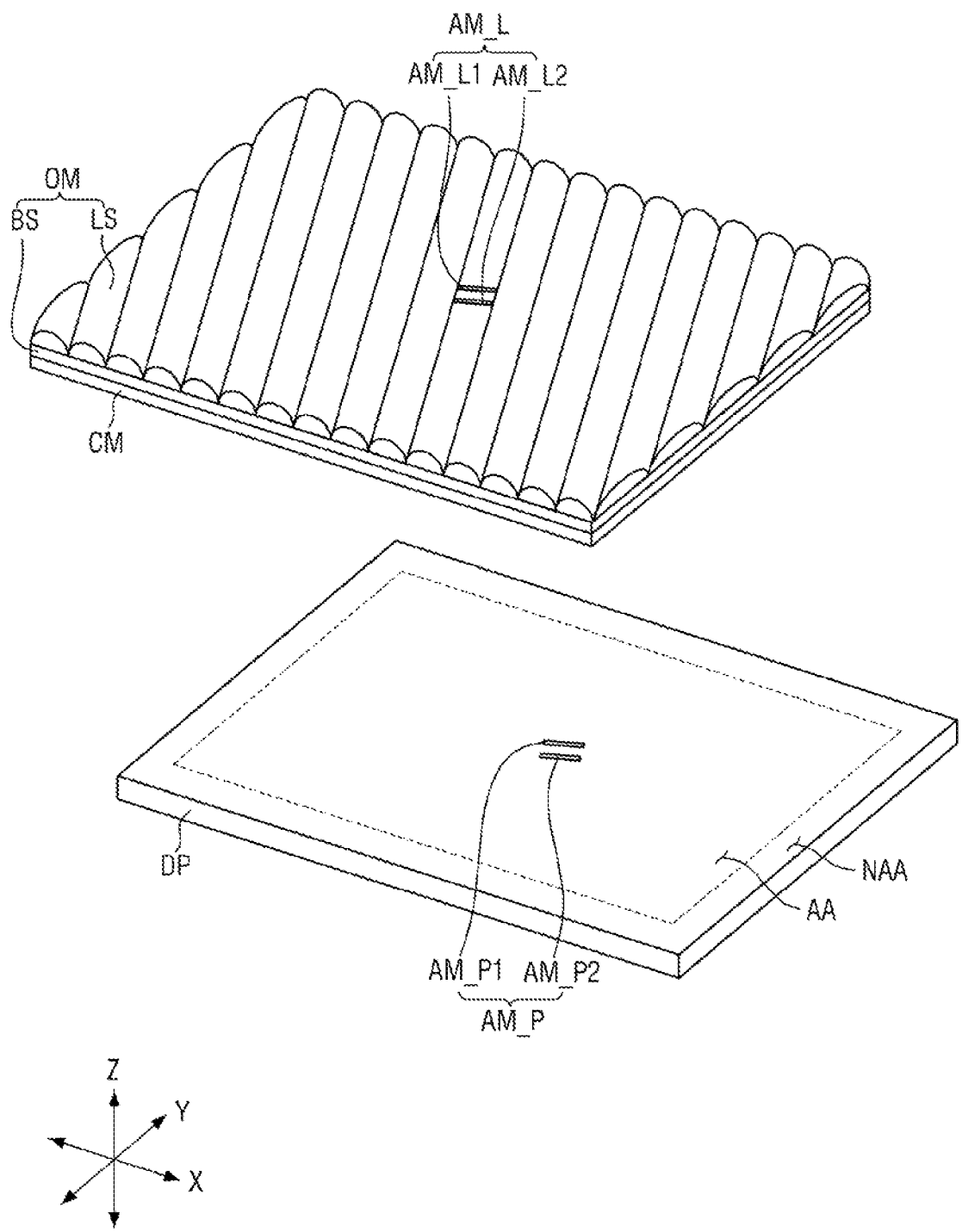
FIGS. 16, 17 and 18 are views illustrating operations in the method of manufacturing a display device according to the embodiment of the present invention.
Figure 17:
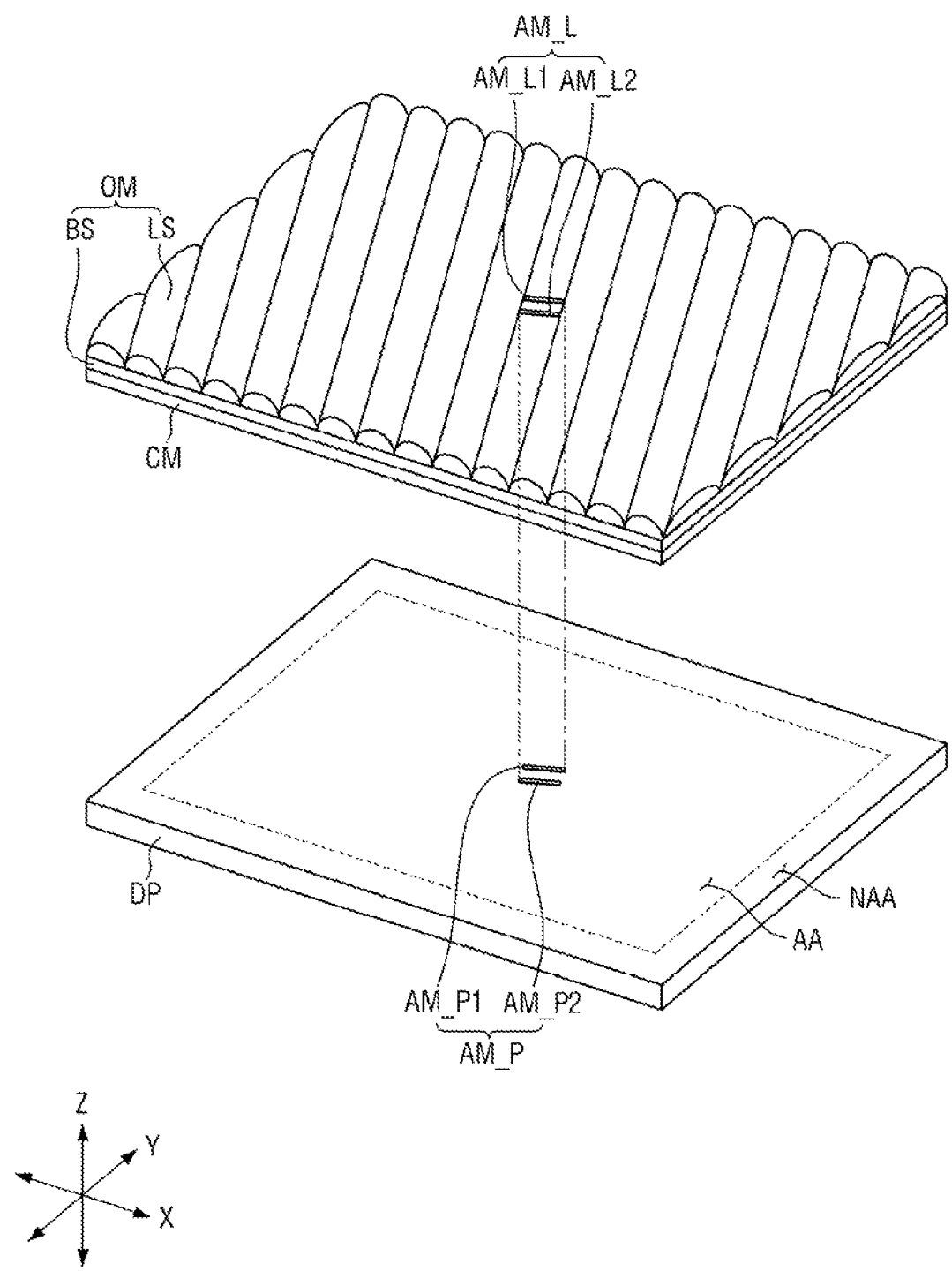
Figure 18:
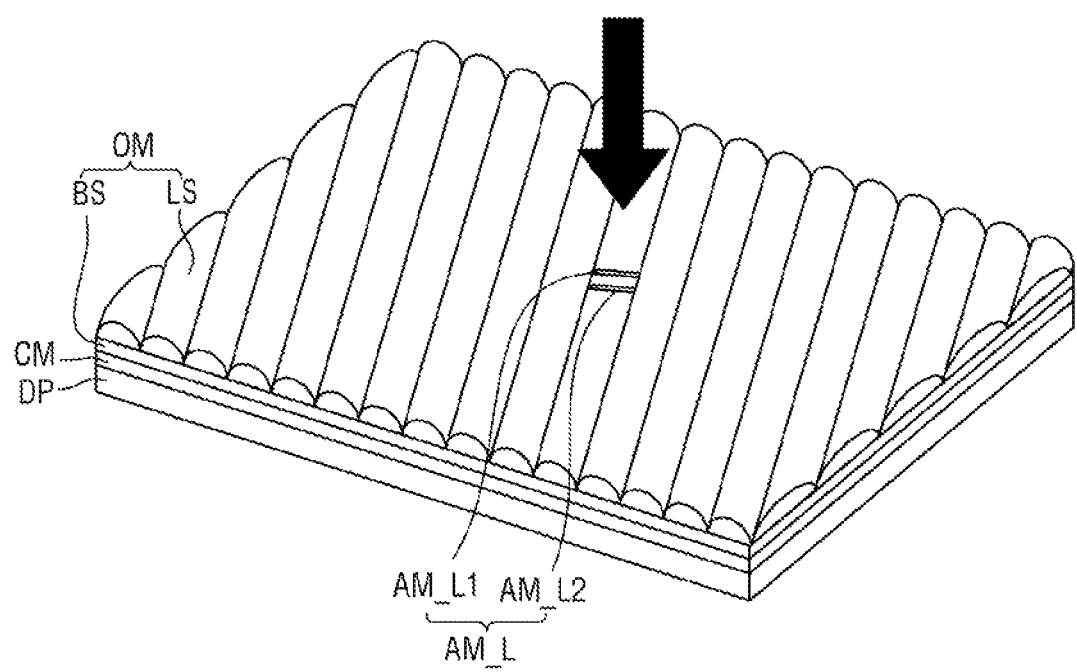

FIG. 15 is a flowchart illustrating a method of manufacturing a display device according to an embodiment of the present invention. FIGS. 16 through 18 are views illustrating operations in the method of manufacturing a display device according to the embodiment of the present invention.

Referring to FIG. 15, the method of manufacturing a display device according to the embodiment may include aligning a first alignment mark AM_L, which is marked to overlap a plurality of lenses LS of an optical member OM, with a second alignment mark AM_P, which is marked between a plurality of subpixels SPX of a display panel DP (S1). The method further includes bonding the optical member OM and the display panel DP together (S2). Here, for example, the first alignment mark AM_L and the second alignment mark AM_P may be 2D magnets.

However, the method of manufacturing a display device is not limited to the above example. For example, at least some of the above operations may be omitted, or at least one other operation may be further included with reference to other descriptions in the present specification.

The method of manufacturing a display device will now be described in detail with further reference to FIGS. 16 through 18.

Referring to FIG. 16, a display panel DP and an optical member OM may be prepared.

A first alignment mark AM_L may be marked on the optical member OM, and a second alignment mark AM_P may be marked on the display panel DP. For example, the first alignment mark AM_L may be marked on a lower surface of a base member BS of the optical member OM. However, the present invention is not limited thereto. For example, the first alignment mark AM_L may be marked between the base member BS and a lens LS or may be marked on the lens LS.

As described above, for example, the first alignment mark AM_L may be marked at a position adjacent to a center OM_C of the optical member OM, and the second alignment mark AM_P may be marked at a position adjacent to a center DP_C of the display panel DP. For example, as illustrated in FIG. 5, a first sub-alignment mark AM_L1 and a second sub-alignment mark AM_L2 of the first alignment mark AM_L may be marked to overlap a lens LS, among a plurality of lenses LS, passing through the center OM_C of the optical member OM, and a third sub-alignment mark AM_P1 and a fourth sub-alignment mark AM_P2 of the second alignment mark AM_P may be marked between a plurality of subpixels SPX adjacent to the center DP_C of the display panel DP. For another example, as illustrated in FIGS. 6 through 9, the first alignment mark AM_L and the second alignment mark AM_P may be marked at a corner of the optical member OM and a corner of the display panel DP, respectively.

In FIG. 16, the lenses LS may be, but are not limited to, slanted lenses LS. Referring further to FIG. 12, the lenses LS may be disposed parallel to the second direction Y.

Referring further to FIGS. 5 through 13, a direction in which the first sub-alignment mark AM_L1, the second sub-alignment mark AM_L2, the third sub-alignment mark AMP 1, and the fourth sub-alignment mark AM_P2 extend may vary according to the shape in which the subpixels SPX are arranged (e.g., the shape of a non-emission area NLA).

Referring to FIG. 17, the optical member OM and the display panel DP may be aligned so that the first alignment mark AM_L and the second alignment mark AM_P overlap each other in the thickness direction. In an embodiment of the present invention, the first sub-alignment mark AM_L1 may overlap the third sub-alignment mark AM_P1, and the second sub-alignment mark AM_L2 may overlap the fourth sub-alignment mark AM_P2.

The optical member OM and the display panel DP may be aligned by a magnetic force between the first alignment mark AM_L and the second alignment mark AM_P. The first sub-alignment mark AM_L1 and the third sub-alignment mark AM_P1 may have different polarities from each other so that an attractive force can act between them, and the second sub-alignment mark AM_L2 and the fourth sub-alignment mark AM_P2 may also have different polarities from each other so that an attractive force can act between them. In this case, the polarity of the first sub-alignment mark AM_L1 and the polarity of the second sub-alignment mark AM_L2 may be the same or different.

In an embodiment of the present invention, the optical member OM and the display panel DP are aligned only by a magnetic force, but the present invention is not limited thereto. A detector such as a vision camera may be further applied to the alignment of the optical member OM and the display panel DP to help align the optical member OM and the display panel DP.

Referring to FIG. 18, after being completely aligned, the optical member OM and the display panel DP may be bonded together. The optical member OM may be bonded to the display panel DP by a coupling member CM. The coupling member CM may include, but is not limited to, an ultraviolet curing resin and/or a thermosetting resin. In an embodiment of the present invention, the coupling member CM may be disposed on a lower surface of the base member BS of the optical member OM, but the present invention is not limited thereto. The coupling member CM may also be disposed on an upper surface of the display panel DP.

The method of manufacturing a display device according to the embodiment has a simple process, has no loss of an active area of a display panel and can have high alignment accuracy, when compared with a conventional image algorithm-based alignment method using a pattern of light passing through an optical member or compared with a physical alignment method of forming an alignment key on a lens and the display panel.

A display device and method of manufacturing the same according to an embodiment of the present invention can have increased alignment accuracy.

However, the effects of the present invention are not restricted by the content exemplified above, and more various effects may be included in the present invention.

While the present invention has been described with reference to the embodiments thereof, it will be understood by those of ordinary skill in the art that various changes in form and detail may be made thereto without departing from the spirit and scope of the present invention.

What is claimed is:

1. A display device comprising:
    an optical member comprising a plurality of lenses and a first alignment mark disposed to overlap at least one lens of the plurality of lenses; and
    a display panel comprising a plurality of subpixels and a second alignment mark disposed between the plurality of subpixels and overlapping the first alignment mark,
    wherein each of the first alignment mark and the second alignment mark comprises a magnetic substance,
    wherein first and second ends of the first alignment mark are respectively aligned with first and second boundaries of the at least one lens of the plurality of lenses.

2. The display device of claim 1, wherein the magnetic substance comprises a two-dimensional (2D) magnet including a single magnetic atomic layer.

3. The display device of claim 1, wherein the magnetic substance comprises iron-germanium-ditelluride ($Fe_4GeTe_2$).

4. The display device of claim 1, wherein a thickness of the magnetic substance is 1 nm to 1000 nm.

5. The display device of claim 1, wherein the first alignment mark comprises a first sub-alignment mark and a second sub-alignment mark spaced apart from each other, and the second alignment mark comprises a third sub-alignment mark and a fourth sub-alignment mark spaced apart from each other, wherein the first sub-alignment mark overlaps the third sub-alignment mark in a thickness direction, and the second sub-alignment mark overlaps the fourth sub-alignment mark in the thickness direction.

6. The display device of claim 5, wherein the first sub-alignment mark and the third sub-alignment mark have different polarities from each other, and the second sub-alignment mark and the fourth sub-alignment mark have different polarities from each other.

7. The display device of claim 1, wherein the first alignment mark is disposed adjacent to at least one corner of a plurality of corners of the optical member, and the second alignment mark is disposed adjacent to at least one corner of a plurality of corners of the display panel.

8. The display device of claim 7, wherein the display panel comprises an active area and a non-active area, wherein the active area provides an image, wherein the non-active area does not provide the image, and wherein the second alignment mark is disposed in the non-active area.

9. The display device of claim 8, wherein the second alignment mark is disposed between dead pixels, of the plurality of subpixels, disposed in the non-active area.

10. The display device of claim 7, wherein the display panel comprises an active area and a non-active area, wherein the active area provides an image, wherein the non-active area does not provide the image, and wherein the second alignment mark is disposed in the active area.

11. The display device of claim 1, wherein the first alignment mark and the second alignment mark extend in a direction intersecting a direction in which each of the plurality of lenses extends.

12. The display device of claim 1, wherein a plurality of view images provided by the plurality of subpixels are refracted by the plurality of lenses to a plurality of viewpoints, respectively.

13. A display device comprising:
an optical member comprising a plurality of lenses and a first alignment mark disposed to overlap at least one lens of the plurality of lenses; and
a display panel comprising a plurality of subpixels and a second alignment mark disposed between the plurality of subpixels and overlapping the first alignment mark,
wherein each of the first alignment mark and the second alignment mark comprises a magnetic substance,
wherein the first alignment mark overlaps a lens, among the plurality of lenses, passing through a center of the optical member, and the second alignment mark is disposed between subpixels among the plurality of subpixels, wherein the subpixels of the plurality of subpixels are overlapped by the lens passing through the center of the optical member.

14. The display device of claim 13, wherein the display panel comprises an active area and a non-active area, wherein the active area provides an image, wherein the non-active area does not provide the image, and wherein the second alignment mark is disposed in the active area.

15. A display device comprising:
an optical member comprising a plurality of lenses and a first alignment mark disposed to overlap at least one lens of the plurality of lenses; and
a display panel comprising a plurality of subpixels and a second alignment mark disposed between the plurality of subpixels and overlapping the first alignment mark,
wherein each of the first alignment mark and the second alignment mark comprises a magnetic substance,
wherein the second alignment mark is disposed in a non-emission area between the plurality of subpixels.

* * * * *